United States Patent [19]

Mehnert

[11] Patent Number: 4,719,415

[45] Date of Patent: Jan. 12, 1988

[54] ARRANGEMENT FOR THE MEASUREMENT OF THE ELECTRIC VOLTAGE PARAMETERS OF A HIGH VOLTAGE CONDUCTOR

[75] Inventor: Walter Mehnert, Ottobrunn, Fed. Rep. of Germany

[73] Assignee: MITEC Moderne Industrietechnik GmbH, Ottobrunn, Fed. Rep. of Germany

[21] Appl. No.: 736,626

[22] Filed: May 21, 1985

[30] Foreign Application Priority Data

May 24, 1984 [DE] Fed. Rep. of Germany ....... 3419429
Feb. 13, 1985 [DE] Fed. Rep. of Germany ....... 3504945

[51] Int. Cl.$^4$ .................... G01R 31/00; G01R 29/22; G01R 29/12
[52] U.S. Cl. ..................................... 324/96; 324/109; 324/458
[58] Field of Search ................. 324/117 R, 96, 109, 324/72, 458, 457

[56] References Cited

U.S. PATENT DOCUMENTS 1,438,974 12/1922 Wente ................................. 324/109
3,938,039 2/1976 Hermstein et al. .................... 324/96
4,370,612 1/1983 Puech et al. ...................... 324/117 R
4,547,729 10/1985 Adolfson et al. ..................... 324/96

FOREIGN PATENT DOCUMENTS 0010221 4/1980 European Pat. Off. .
606438 5/1930 Fed. Rep. of Germany .
2409595 8/1985 Fed. Rep. of Germany .

OTHER PUBLICATIONS

Japanese Patent Abstract, vol. 7, No. 238 (P-231) (1383) Oct. 22, 1983 (1 page), 58-124961.
Review of Scientific Instruments, vol. 47, No. 5, May 1976, pp. 621-623.

*Primary Examiner*—Reinhard J. Eisenzopf
*Assistant Examiner*—Vinh P. Nguyen
*Attorney, Agent, or Firm*—Sughrue, Mion, Zinn, Macpeak, and Seas

[57] ABSTRACT

For the measurement of the voltage parameters, such as instantaneous value, phase position, absolute value or sign of the high voltage of a high voltage conductor (1), a sensor (15) is conductively connected with a reference electrode and a non-earthed electrode (10) arranged along an equipotential surface in the proximity of the high voltage conductor (1), which electrodes both lie at a defined potential. The reference electrode can be the high voltage conductor (1), a second electrode (50) arranged on an equipotential surface or an auxiliary conductor (57) conductively connected with the high voltage conductor (1). The sensor, which can be a one-sidedly clamped mechanical piezo-oscillator, modulates the brightness of a radiated-in light bundle (32), which is reflected to the measuring device, converted by a receiver (40) into an electrical signal and evaluated. For the testing of the functional capability, an excitation signal, which is independent of the energy of the high voltage conductor, can be transmitted to the sensor (15) for the short-term modulation of the light bundle radiated in. For recognition of the zero position in the presence of a direct voltage at the high voltage conductor, the sensor can be switched free of voltage or reversed in polarity by means of a circuit arrangement which is testable in respect of functional capability.

38 Claims, 17 Drawing Figures

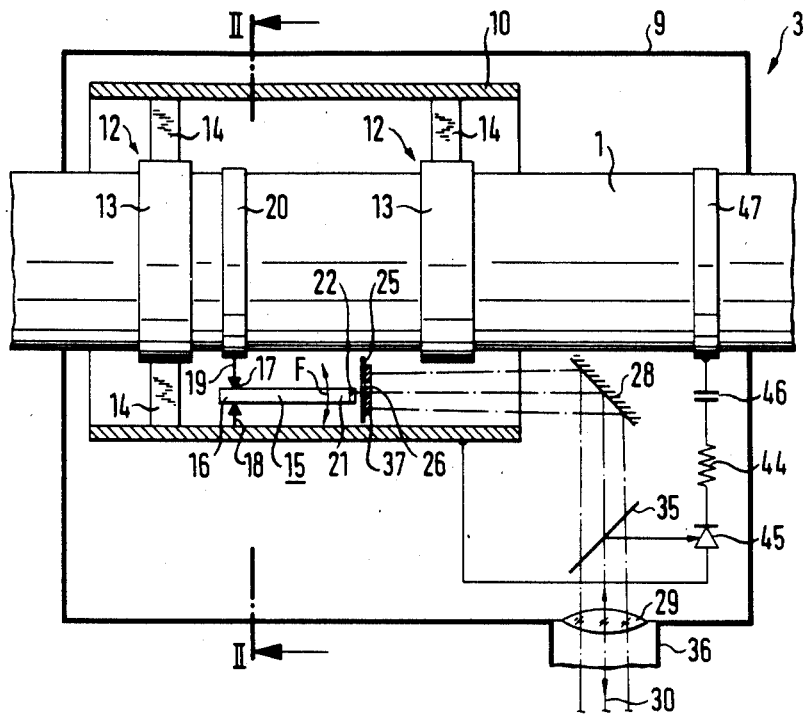
FIG. 1
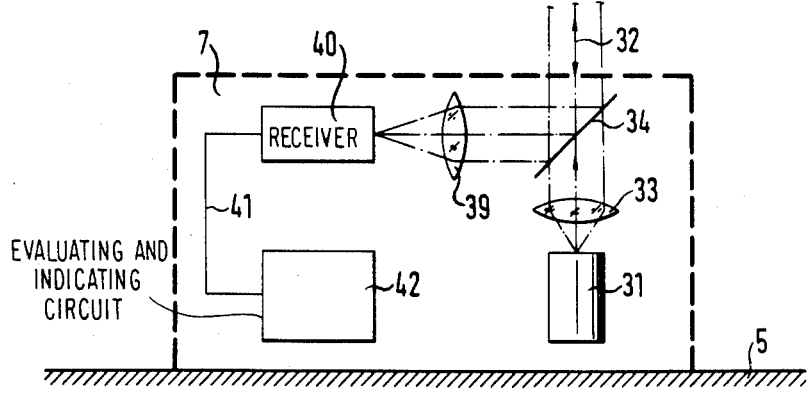

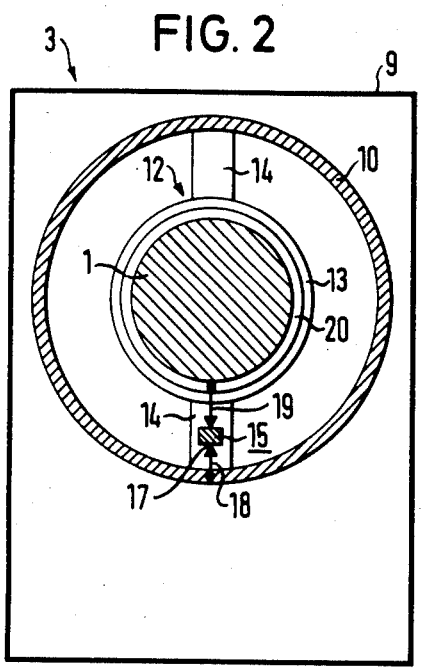
FIG. 2
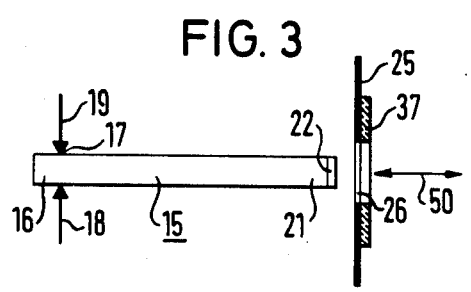
FIG. 3
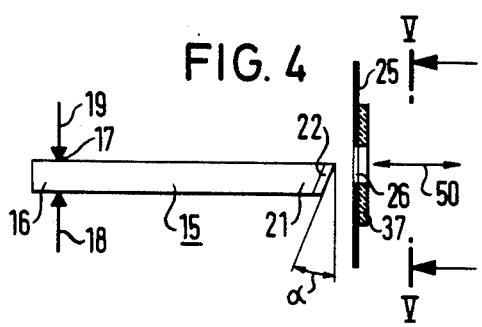
FIG. 4
FIG. 5
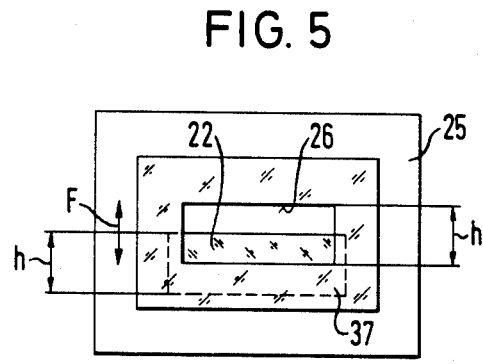
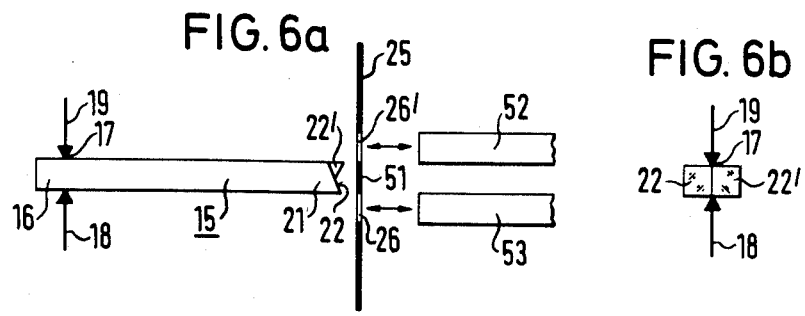
FIG. 6a    FIG. 6b

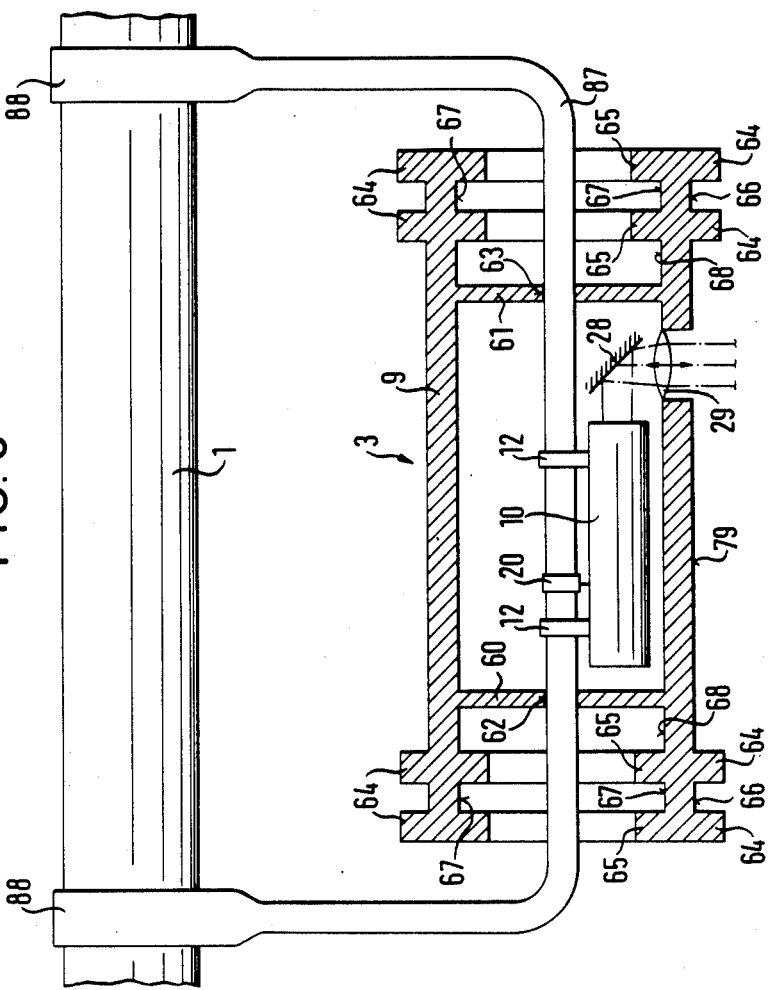
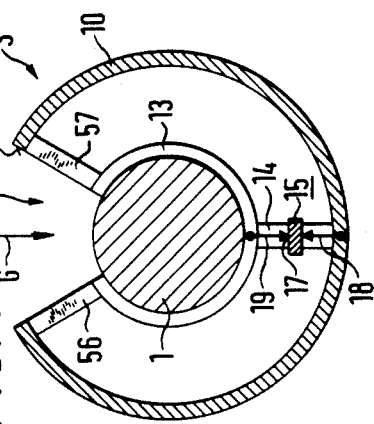
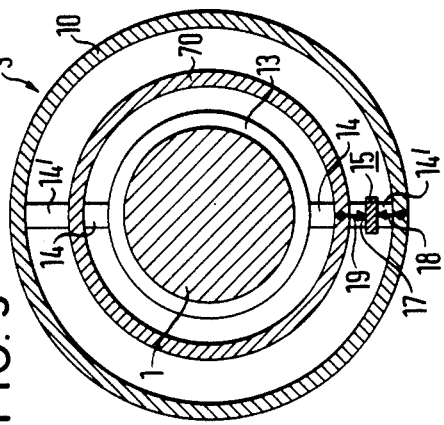

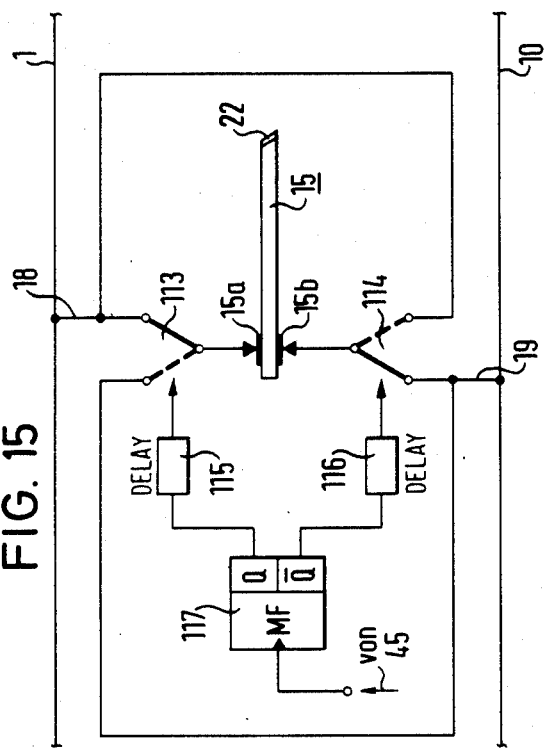
FIG. 15
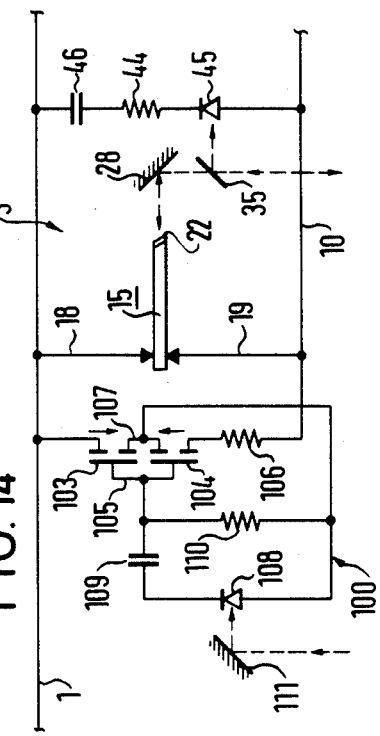
FIG. 14
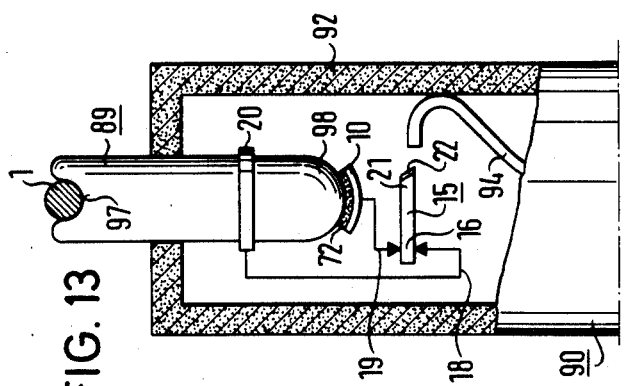
FIG. 13
FIG. 12
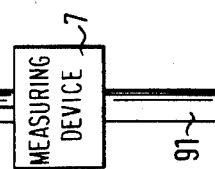

ARRANGEMENT FOR THE MEASUREMENT OF THE ELECTRIC VOLTAGE PARAMETERS OF A HIGH VOLTAGE CONDUCTOR

FIELD OF THE INVENTION

The invention concerns an arrangement for the measurement of the electric voltage parameters of a high voltage conductor.

To be understood by the term "high voltage" in the present context are direct and alternating voltages which lie in a range of 1 kilovolt to 800 kilovolts. The expression "voltage parameter" means that in the case of direct voltages, not only their absolute value, but also the sign, and in the case of alternating voltages, not only the crest or effective value, but also the temporal voltage course are measurable so that the relative phase position of several such voltages can be ascertained and stated numerically.

BACKGROUND OF THE INVENTION

Arrangements of the initially named kind are for example always used when it must be made certain before the starting of operations at a high voltage conductor or in its immediate proximity that the conductor is free of voltage or can be earthed without danger for the conducting-away of coupled-in reactive voltages.

For the detection of the alternating voltage and/or the alternating current in overland lines, an arrangement of the initially named kind is known from U.S. Pat. No. 4,002,975 and comprises a measuring head which is arranged at the upper end of a carrier column consisting of insulating material and firmly connected by way of this column with the measuring device. For the measurement of the voltage, the measuring device is so set up on the soil beside a mast of the overland line that the measuring head is disposed in the proximity of the high voltage conductor, however without touching this. Arranged in the measuring head is a sensor, onto which a light bundle is projected in the interior of the carrier column from the measuring device, which light bundle passes through the sensor and is reflected by way of a mirror arranged behind the sensor back again to the measuring device. The sensor in the present case influences the light bundle in the manner that it turns the plane of polarisation of the linearly polarised light in dependence on the intensity of the surrounding electric or magnetic field. The change in polarisation of the reflected light bundle is measured in order to indicate the intensity of the field surrounding the high voltage conductor. Since the polarisation modulation co-efficient of crystals of that kind depends to very strong degree on the surrounding temperature, the measurement head furthermore contains a temperature-measuring device, which is likewise interrogatable by way of a light bundle and either delivers a correction signal or serves to heat the measuring head by way of the carrier column and thus keep it at a predetermined temperature.

This known arrangement is on the one hand unwieldy, because the carrier column, which connects the measuring device with the measuring head, must display an appreciable length in order that the sensor in the case of overland lines can be brought sufficiently closely to the voltage-conducting conductors. For the other thing, the accuracy of the measurement is influenced to an appreciable degree by the spacing, which the measuring head and thereby the sensor possess from the high voltage conductor. Since the spacing of the conductors of overland lines to the soil is defined exactly only in immediate proximity of the carrier masts, this known measuring device must also be set up beside these carrier masts. There, the field surrounding the high voltage conductor is however distorted to a great extent due to the earthed parts of the mast disposed in the proximity so that even when the spacing of the sensor from the high voltage conductor is known to great accuracy, which however is normally not the case in practice, an exact measurement is not possible.

Such a low measurement accuracy however represents an appreciable source of danger, because it does not permit the reactive voltages already mentioned above to be distinguished with absolute certainty from the high voltage which is present at the high voltage conductor when this is connected with the power source.

The extent, to which the employed sensors can vary the polarisation of the light bundle radiated in, is very small even in the presence of the full nominal high voltage so that only a very small measurement signal arises. Beyond that, the measurement light is very strongly damped through these sensors and the associated polarisation filters, whereby only a very weak reflected light bundle, which is difficult to evaluate because of its unfavourable signal-noise ratio, comes back to the actual measuring device in the case of greater measurement paths. For this reason and because of the then required, very long carrier column for the measuring head, the known device is not suitable for a measurement over greater paths, for example at free lines with a height of 100 meters or more above the soil.

The known device is completely unsuitable also for a further important case of application, in which the freedom from voltage of a high voltage conductor disposed in the interior of a switch box filled with $SF_6$ must be ascertained. Such a switch box may only be opened when no high voltage is present, because the protective effect of the $SF_6$ is reduced or completely cancelled through the ingress of air and it would come to extremely dangerous and destructive voltage flash-overs, if the switch box were to be opened with high voltage present.

In order to avoid a deterioration of the accuracy of the measuring result, it is further known, to arrange a sensor unit in the close proximity of the respective high voltage conductor, which sensor unit comprises two electric field conductors which are arranged spaced apart and electrically isolated from each other in such a manner that the electric high voltage field generates a voltage drop therebetween. For example, one of these field conductors is the high voltage conductor itself, whereas the other one is a not earthed electrode extending substantially along an equipotential surface of the electric high voltage field. The sensor is electrically connected with said two electric field conductors. By these measures the voltage drop between the two electric field conductors, which is detected by the sensor and translated into an influencing of the light bundle radiated in, is defined exactly, because it now depends only on the fixed mutual arrangement of parts of the sensor unit, which in its turn at least during the measurement due to the direct contact of the high voltage conductor assumes an exactly defined and reproducible position relative thereto.

In all the cases in which the sensor unit is not readily accessible for a checking of its functional capability, an indication, that no high voltage is present at the high voltage conductor, delivered by the measuring device, is reliable only when it is certain at the same time that the sensor unit operates unobjectionably.

However, none of the known devices comprises any means which make possible to check whether the sensor in an inaccessible sensor unit is working correctly or not.

SUMMARY OF THE INVENTION

Therefore, it is an objective of the invention to provide an arrangement of the initially named kind which makes possible the safe operational testing of the sensor even in such cases in which the sensor unit is not accessible.

In practicing the invention it is provided that the sensor is excitable to a variation of the radiated-in light bundle through an excitation signal which is independent of the high voltage energy transmitted in the high voltage conductor. This can occur in the form that a battery of condensers, which is for example chargeable through a photo-cell, is arranged in the sensor unit, the energy of which battery is discharged by way of the sensor means by reason of an excitation signal, which can be radiated-in in optical or acoustic manner or by radio, and in that case causes the sensor for example briefly to vary the brightness or the polarisation of the radiated-in light bundle. If a change of that kind is then detected and indicated at the measuring device, it can be presumed therefrom that the sensor unit operates unobjectionably and the absence of a measuring signal is to be traced back to the fact that actually no high voltage is present at the high voltage conductor. In order to obtain a check signal which is particularly well evaluatable, the sensor is preferably constructed as part of an oscillatory system which possesses an exactly defined resonant frequency which is clearly different from the frequency of the alternating field to be measured and amounts to, for example, 1.5 kiloHertz for an alternating high voltage of 50 Hertz or 60 Hertz. Furthermore, the oscillatory system comprises a receiver for the excitation signal, which receiver is preferably constructed as photodiode which can be radiated with light from the measuring device, which light is in this case modulated in brightness at a frequency which is equal to the resonant frequency of the oscillatory system or comes as near as possible to this. Since only a very low energy is required for the impulsing of the resonant oscillation, the voltage, which is delivered by reason of the light radiated-in by the photodiode operating in purely photo-voltaic manner, suffices to check the functional capability of the sensor unit in the described manner.

If a sensor is employed, which modulates the brightness of the radiated-in light in dependence on the surrounding alternating field, then the amplitude of the signal delivered by the photo-electric receiver serves as a measure of the magnitude of the voltage present at the high voltage conductor. If the sensor unit is arranged in the open and the measurement light transmission takes place between measuring device and sensor unit with the aid of a telescope arrangement, then the magnitude of the amplitude of the output signal of the photoreceiver for a given brightness of the light radiated by the measuring device is influenced not only by the magnitude of the high voltage to be measured, but also by a series of disturbing factors, of which the most important are the temperature of the sensor and the transparency of the air disposed between measuring device and sensor unit. The pollution, loading with water vapour or icing of parts of the projection device also play a part here, but countermeasures effective from the start, such as encapsulation, dirt-repelling surface treatment of lenses and mirrors and similar let themselves be taken against these last-mentioned disturbing effects. However, the dependence on temperature and transparency are not always constructionally influenceable so that compensating measures according to the invention are taken here.

Serving to eliminate the temperature dependence of the sensor is the already mentioned excitation signal, with the aid of which the sensor can be impulsed to an influencing, which is independent of the energy transmitted in the high voltage conductor, of the light radiated in. Correction values for the elimination of the temperature dependence of the oscillatory behaviour of the sensor as well as for the elimination of the remaining environmental influences let themselves be obtained from the amplitude, with which the sensor reacts to the excitation signal, as well as also from the damping course of the oscillation of the sensor decaying after termination of the excitation signal. For example, it is possible from the amplitude of the oscillation of the sensor forced by the high voltage field and from the amplitude of the resonant oscillation caused by the excitation signal to form the ratio in order to attain a temperature compensation. Another possibility consists in determining calibration values in dependence on the temperature from the amplitude and the damping behaviour of the resonant oscillation impulsed by the excitation signal, which calibration values can then be drawn upon during the respective measurement for the correction of the high voltage measurement value of interest.

Preferably, the measuring device to be manipulated by the operating person is freely movable relative to the sensor unit, i.e. the measuring device is either always completely separated physically from the sensor unit, wherein the measuring light is transmitted through a projection device formed by a telescope arrangement, or it is merely during the measurement operation connected with the sensor unit by way of a light conductor arrangement forming a part of the projection device, wherein this light conductor arrangement preferably consists of two light-conducting fibres, of which the one is mounted at the sensor unit and possesses such a length that its free end is accessible free of danger. A further light-conducting fibre belonging to the measuring device can then be optically coupled, for example through a plug connector, with this free end for the duration of the measurement.

The first embodiment is intended above all for a use at overland lines, wherein a respective sensor unit can be permanently mounted at each of a plurality of high voltage conductors. All these sensor units can be taken bearings on respectively from the soil for the performance of a measuring operation with the aid of a single measuring device. Alternatively, the sensor unit can also be so constructed that it is plugged onto the high voltage conductor only for the duration of the measurement operation and then again taken off.

The second embodiment is particularly suitable for switch boxes which are filled with $SF_6$. The sensor unit is here permanently mounted at the high voltage conductor in the interior of the switch box. The end of the associated light-conducting fibre remote from the sensor is connected with the one part of an optical connector which is so installed in gas-tight manner in an external wall of the switch box that the other part of the optical connector, in which the light-conducting fibre belonging to the measuring device ends, can be plugged on free of danger from outside.

Serving as reference electrode in each case can be either the high voltage conductor itself or a second electrode which is arranged in corresponding manner as the first electrode relative to the high voltage conductor at a defined spacing which so differs from the spacing of the first electrode from the high voltage conductor that the voltage required for the operation of the sensor is present between both the electrodes.

A further possibility consists in providing as reference electrode an auxiliary conductor which is electrically conductively so connected with the high voltage conductor that a smallest possible distortion of the potential field arises. This auxiliary conductor then in its turn carries the first (and in a given case the second) electrode as well as the remaining parts of the sensor unit, wherein particularly the electrode(s) again assume(s) an exactly defined position in the potential field.

In a third embodiment, the measuring device and the sensor unit are connected each with the other through an insulating rod which possesses such a length that it can be gripped at the one end by the operating person and be brought by the other end, from which an auxiliary conductor protrudes, free of danger into direct galvanically conducting contact with the high voltage conductor. This embodiment is suitable for high voltage lines extending low over the soil as well as for the case, in which the operating person must climb up a carrier mast of an overland line and there ascertain the freedom of the high voltage conductor from voltage. Since the rod possesses only the length absolutely necessary for a voltage protection, it can in this case be taken along. Beyond that, it can be constructed to be pushable together in the manner of a telescope. Preferably, the sensor unit is housed in the interior of the rod constructed to be hollow in the proximity of the upper end of the rod, whilst the measuring device is disposed in the proximity of the other end to be gripped by the operating person. The connection between measuring device and sensor unit can for example be produced by a light-conducting fibre extending in the interior of the rod.

In each of these refinements, the device according to the invention operates as capacitive voltage divider, in which the capacitance of the sensor between the high voltage conductor or the auxiliary conductor or the second electrode and the first electrode and the capacitance of the first electrode against earth lie in series one with the other. Sensors are at disposal, by which a capacitance of less than 100 picoFarads lets itself be attained readily. An electrode capacitance to earth of a few picoFarads is attainable through a suitable size of the first electrode and a suitable choice of its spacing from the reference electrode. In the case of the high voltages to be measured, the field surrounding the high voltage conductor is readily strong enough in order in the case of such a division ratio to supply the sensor adequately with energy.

The hitherto described principle according to the invention is not restricted to the use of a quite certain sensor type. Basically, any sensor can be employed, which possesses a sufficiently small capacitance and reacts to the field strength changes in the surroundings of the high voltage conductor or of the auxiliary conductor. Suitable inter alia are PLZT-platelets or PLMZT-platelets, which scatter light passing through them differently strongly in dependence on the applied voltage so that differently large quantities of light pass through an aperture following downstream in the light path and the brightness of the light bundle conducted back to the measuring device is modulated hereby.

Also, sensors changing the polarisation properties of the light bundle radiated in can in principle find use.

Particularly preferred is however a mechanical oscillator, for example a rod which consists of piezo-electric material and is mechanically clamped in the proximity of its one end and the free end of which is deflected out of the rest position in dependence on the surrounding field strength. If the high voltage conductor, at which a sensor unit with such a mechanical oscillator is fastened or comes into electrically conducting contact by way of an auxiliary conductor, carries alternating voltage, then this leads to a periodic bending oscillation of the piezo-crystal, the frequency of which is equal to that of the alternating voltage and the amplitude of which is proportional to the amplitude of the field strength and thereby to the high voltage. This oscillation is according to the invention employed in order to modulate a light bundle, which is radiated in from the measuring device and reflected to the measuring device, in its brightness so that an electrical alternating signal, the amplitude of which is proportional to the high voltage and which reproduces the phase position of the high voltage and which can be correspondingly evaluated and indicated, can be obtained from the modulated light with the aid of a photo-receiver.

If the high voltage conductor, at which a sensor unit with such a mechanical oscillator is fastened, thereagainst carries a direct voltage, then the mechanical oscillator is deflected only one-sidedly and permanently out of its rest position. This deflection, too, can be employed to vary the brightness of a radiated-in light bundle proportionally to the deflection so that a measurement value and an indication of the magnitude and the sign of the high voltage present can be obtained from the light bundle conducted back.

For the attainment of the brightness modulation, the mechanical oscillator, which is clamped in the proximity of its one end, preferably carried at the end face of its free end a preferably evaporated-on reflecting layer which is impinged by the light bundle radiated in from the projection device and reflects a part thereof, the magnitude of which depends on the high voltage to be measured, into the projection device, from which this part is guided back to the measuring device. By reason of the periodic or permanent deflection, effected by the high voltage, of the free end of the mechanical oscillator out of its rest position, the reflecting layer is laterally displaced relative to the optical axis of the projection device and at the same time tilted angularly. Both contributes to the quantity of light, which is conducted back to the measuring device, being changed in dependence on the deflection, wherein a largely linear relationship is attainable through suitable choice of the mirror shape, the inclination of the mirror to the optical axis in the rest position of the oscillator and the size and shape of the entry aperture (hole or slit aperture or end face of a light-conducting fibre) and it is attained that the light reflected on maximum deflection possesses maximum brightness.

A mechanical oscillator of that kind as sensor beyond that offers the advantages that, on the one hand, it damps the light radiated in only to a small degree and, on the other hand, makes possible a very high degree of modulation. Thus, one obtains a very good signal-noise ratio and maximum brightness of the light received at the photo-receiver. Thereby, measurements are possible with high accuracy even over great spacings.

It is expressly to be pointed out that light source and light receiver need not necessarily be housed in one and the same housing and set up at the same place. It is however preferred to combine these parts of the arrangement into a compact measuring device because of the better manipulability resulting herefrom.

For taking into consideration the influence of the air transparency and possible changes in the transparency or the reflective power of lenses, mirrors and other optical elements of the projection equipment through misting-up, pollution or aging, when an alternating high voltage shall be measured, a stationary mirror can beyond that be provided in immediate proximity of the sensor, which mirror receives a predetermined part of the measurement light substantially on the same optical path, on which the measurement light gets to the sensor, and this constant light component not influenced by the sensor can be reflected to the measuring device in substantially the same path, on which also the measuring light demodulated by the sensor is transmitted back. With the exception of the influencing by the sensor itself, this constant light component is thus subjected to the same environmental influences as the measurement light and can be used to make the measurement independent of the absolute brightness of the received measurement light. For this purpose, the constant light component can be separated from the measurement light component with the aid of change-over switch equipments or beam dividers optically or in electrical manner after reception through one and the same photo-electric receiver. During the measurement of a direct high voltage, the stationary mirror must however be omitted when the constant light component produced by it can not be separated from the constant light component of the high voltage.

For the performance of a determination of the relative phase position of the alternating voltages of two or more high voltage conductors, a sensor unit is mounted according to the invention on each of the high voltage conductors and the reflected light is each time conducted to an individual electro-optical receiver. These receivers can all be housed in one and the same measuring device or an appropriate number of measuring devices, of which each possesses an individual receiver, can be coupled one with the other.

As already mentioned, the arrangement according to the invention is also suitable for the measurement of direct high voltages. This is of significance not only when the high voltage conductor to be tested in any case always carries direct voltage. In the case of alternating high voltage conductors, too, above all in the case of free and overland lines, a very high direct voltage potential, which makes a danger-free touching or earthing of the conductor impossible, can be induced in the high voltage conductor, for example by an electrically charged thunder cloud standing above the line, when the alternating voltage is switched off.

In order to be able to measure the magnitude of direct voltages of that kind, it is required to know the zero point of the arrangement, since the sensor in this case does not periodically change the light radiated in, thus for example does not oscillate periodically, but is constantly deflected out of its rest position in a direction corresponding to the sign of the direct voltage. Above all in the case of sensor units mounted fixedly at the high voltage conductor, the determination of the measurement zero point is not readily possible, since the brightness of the light, which is received by the measuring device and reflected by the sensor, is influenced by a plurality of factors and a comparison with the brightness of the light emitted from the measuring device does not lead to usable results.

For the solution of this problem, it is provided according to a particularly preferred embodiment of the invention that the sensor unit comprises a zero-point circuit arrangement, with the aid of which the sensor can be caused to deliver signals, from which its zero-point position lets itself be derived, which corresponds to the voltage-free state of the high voltage conductor. Preferably, this zero-point circuit arrangement consists of one or more controllable switches, with the aid of which the voltage across the sensor can be varied, for example short-circuited or reversed in polarity so that the sensor can even in the presence of a direct voltage be brought either constrainedly into its zero or rest position or be caused to make an equally great deflection in the opposite direction. In the first case, the brightness of the light bundle reflected to the measuring device in the rest position of the sensor then serves as zero value, whilst in the second case, the mean value between both the brightness values before and after the pole reversal can be employed as zero value. Also, the galvanic connection of the sensor with the high voltage conductor and/or the electrode extending along an equipotential surface can be interrupted by a controllable switch in order thus to make the sensor constrainedly free of voltage and cause it to make the transition into the rest position.

The actuation of the controllable switches takes place with the aid of a control circuit, which is housed in the sensor unit and draws its energy for example from the voltage which drops off between the high voltage conductor or the reference electrode and the electrode extending along an equipotential surface. For example, the control circuit consists substantially of a monostable oscillator which by reason of a radiated-in command signal switches the switch or switches for a fixed time out of the rest state into the operative state and then back again into the rest state. It is in that case to be noted that the sensor is brought into its rest position or reversed in polarity in the operative state of the switches.

Preferably, the command signal for the control circuit is radiated in with the aid of the light bundle emitted by the measuring device, for which it is received by a photodiode and translated into an electrical control signal for the controllable switches.

In the cases, in which the sensor is a part of a resonant oscillatory system, which for the checking of the functional capability of the sensor can be excited into oscillations with the aid of an excitation signal even when no voltage is present at the high voltage conductor, a part of this excitation signal can be employed as command signal for the control circuit. Thus, for example, a monostable oscillator can be triggered with the aid of the first rising edge of the excitation signal. If one connects a delay member with a suitable delay time between the respective output of the monostable oscillator and the switch or switches driven from this output, then one can in the case of appropriate formation of the excitation signal derive not only information about the measurement zero-point and the magnitude of the direct voltage present at the high voltage conductor from the light bundle reflected from the sensor, but also about the functional capability of the sensor and the functional capability of the zero-point circuit arrangement.

Another possibility consists in providing, apart from the photo-diode, which serves for the excitation of the resonant oscillatory system, a second photo-diode, to which an individual light bundle is conducted from the measuring device, which light bundle is completely independent of the actual measurement light bundle which also serves for the transmission of the excitation signal for the resonant oscillatory system.

With the aid of this second photo-diode, which likewise operates in purely photo-voltaic manner, a capacitor is charged through a resistor preferably through radiating-in of a constant light signal, wherein the voltage drop, which is caused through the charging current across the resistor, serves as control signal for the actuation of the controllable switches. This control signal is present at the switches independently of the duration of the constant light signal only until the capacitor is completely charged up. Thereby, the possibility exists not only to ascertain the presence of a direct voltage between the high voltage conductor and the sensor, but in conjunction with the resonant oscillatory system apart from the functional capability of the sensor itself also to check that of the zero-point circuit arrangement. In conjunction with semi-conductor switches, this zero-point circuit arrangement distinguishes itself by a particularly low energy requirement which can readily be covered by the radiated-in constant light signal.

BRIEF DESCRIPTION OF THE DRAWING

The invention is described in the following with the aid of examples of embodiment with reference to the drawing; in this, there show:

FIG. 1 a strongly schematic, sectioned side elevation of a first embodiment firmly mounted at the high voltage conductor, FIG. 2 a section along the line II—II of FIG. 1, FIG. 3 in schematic form, the relative position of sensor and aperture according to a first variant, FIG. 4 a view corresponding to that of FIG. 3 according to a second variant, FIG. 5 a strongly enlarged view of the variant of FIG. 4 seen in direction of the arrows V—V, FIGS. 6a and 6b a view, corresponding to that of the FIGS. 4 and 5, of a variant also suitable for the measurement of direct voltages, FIG. 7 a section, corresponding to that of FIG. 2, through a second embodiment of the sensor unit pluggable onto the high voltage conductor, FIG. 8 a view, corresponding to that of FIG. 1, of a sensor unit which is fastened at an auxiliary conductor which is clampable to the high voltage conductor, FIG. 9 a section, corresponding to that of FIG. 2, through a third embodiment with two equipotential electrodes, FIG. 10 a section, corresponding to the upper part of the FIG. 1, through a fourth embodiment of the sensor unit suitable for medium voltages up to about 50 kilovolts, FIG. 11 a fifth embodiment of a sensor unit according to the invention, FIG. 12 an embodiment, in which the measuring device and sensor unit are connected each with the other through an insulating hollow rod, FIG. 13 to enlarged scale, the upper end of the rod of FIG. 12 with a somewhat differently shaped auxiliary conductor, FIG. 14 a schematic circuit diagram of a sensor unit which comprises a zero-point circuit arrangement, FIG. 15 an embodiment, modified compared with FIG. 14, of a zero-point circuit arrangement and FIG. 16 a signal diagram for explanation of the manner of function of the circuit of FIG. 15.

DESCRIPTION OF PREFERRED EMBODIMENTS OF THE INVENTION

Figure 10:
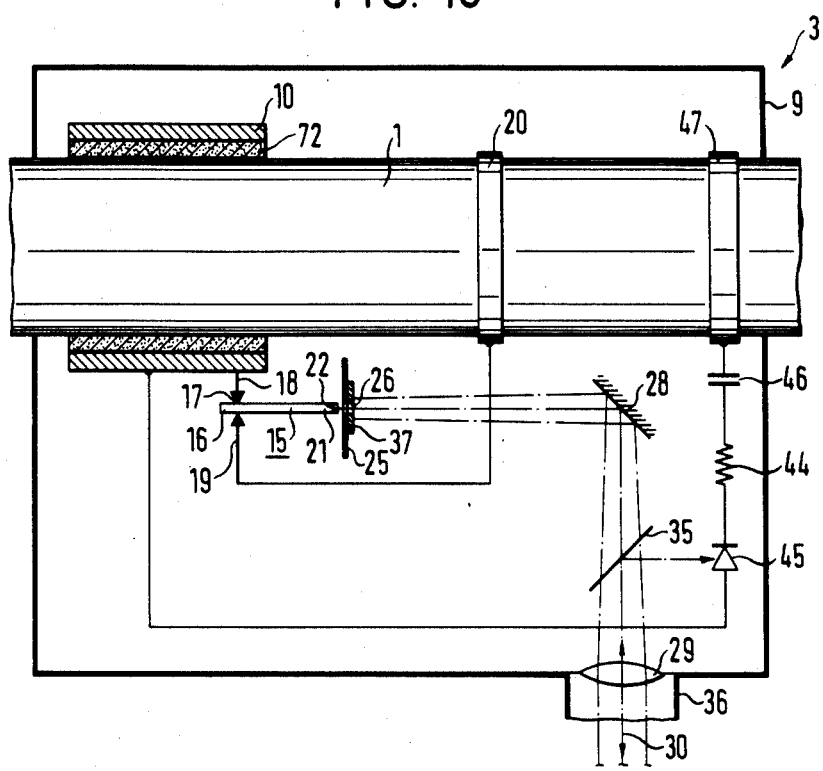

Illustrated in FIG. 1 is an embodiment, which is particularly suitable for voltages greater than 50 kilovolts, of a measuring arrangement according to the invention and consisting of a sensor unit 3 fastened at the high voltage conductor 1 and a transportable measuring device 7, which is completely separate from the sensor unit 3 and placeable on the soil 5.

Sensor unit 3 comprises an electrode 10 of metal within an only schematically indicated, hermetically tight protective housing 9 of non-conducting material, which electrode possesses the shape of a hollow circular cylinder of about 3 centimeters in length and with a diameter of about 3 centimeters and concentrically surrounds the high voltage conductor 1, as is particularly evident also from the FIG. 2. These dimensions are so chosen that a voltage of about 100 volts lets itself be taken off in the case of a high voltage conductor of 60 kilovolts at a frequency of 50 Hertz between the high voltage conductor 1 here serving as reference electrode and the electrode 10, which is disposed on an equipotential surface.

In order to keep the electrode 10 in its exact concentric arrangement with the high voltage conductor 1, two electrode holders 12 of non-conducting material are provided, of which each consists of a sleeve 13 enclosing the high voltage conductor 1 and spacer pieces 14, which project radially from the sleeve 13 and with the outer end of which the electrode 10 is firmly connected.

Arranged between the high voltage conductor 1 and the electrode 10 is a piezo-oscillator 15, which possesses the shape of an elongate rod of rectangular cross-section. The piezo-oscillator 15 is so clamped in the proximity of its one end 16 in a mounting 17 indicated by two arrow points that its longitudinal axis extends substantially parallelly to the longitudinal axis of the high voltage conductor 1.

In the schematic illustration of the FIGS. 1 and 2, it is presupposed that the mounting 17 consists of metal and that its lower part 18 is electrically conductively connected with the electrode 10, whilst its upper part 19 is connected through a conducting sleeve 20 with the high voltage conductor 1. Both the mounting parts 18 and 19 are electrically insulated outwardly.

Due to this arrangement, an alternating voltage, which is proportional to the voltage of the high voltage conductor, is present at the piezo-oscillator 15 when the high voltage conductor 1 carries voltage.

Piezo-oscillators are available, which make it possible to achieve a capacitance of less than 100 picoFarads for the entire, just described arrangement between high voltage conductor 1 and electrode 10. The illustrated electrode 10 possesses a capacitance of about 2 picoFarads relative to earth so that one here obtains a capacitive voltage divider which is in a position of taking up sufficient power in order to excite the piezo-oscillator 15 in direction of the double arrow F into bending oscillations, the amplitude of which is proportional to the amplitude of the voltage carried in the high voltage conductor 1.

The free end 21 of the piezo-oscillator 15 carries a reflecting layer 22. Arranged directly in front of the free end 21 is an aperture 25, the opening 26 of which possesses about the same dimensions, as the reflecting layer 22 facing it, in direction of movement of the piezo-oscillator as well as also perpendicularly thereto.

The aperture opening 26 and the region, directly surrounding it, of the aperture 25 are imaged to infinity by way of a deflecting mirror 28 and a lens 29. Preferably, instead of the mirror 28, a pentagon prism can also be employed, the deflecting angle of which amounts to 90°, whereby an invariability of the ray path can be obtained relative to rotations of this deflecting device around an axis perpendicular to the plane of the drawing of the FIG. 1.

The deflecting mirror 28 is so fastened in a not more closely illustrated manner in the protective housing 9 that the horizontal ray path emanating from the aperture 25 is deflected perpendicularly downwards, where it impinges on the lens 29, which is fastened in the base wall of the protective housing 9 and converts it into a parallel ray bundle 30.

Instead of a free ray path between the mirror surface 22 and the lens 29, a light-conducting fibre can also find use here and have one end fixedly mounted in the manner that it stands opposite the mirror surface 22 in the rest position of the piezo-oscillator 15. This end face of the light-conducting fibre forms the equivalent of the aperture opening 26. The other end of this light-conducting fibre is so to be arranged at a spacing from the lens 29 that the light bundle issuing out of the light-conducting fibre is made parallel. In this case, the lens 29 possesses a substantially shorter focal length than in the case of the example of embodiment illustrated in FIG. 1.

This light-conducting fibre can however also be constructed to be so long that its end remote from the sensor 15 is accessible free of danger and can be connected with the optical output and input of the measuring device 7.

The influence of mechanical oscillations of the high voltage conductor on the measurement result in substantially cut out by the aperture 25 as well as also by the light-conducting fibre, since the suspension of the piezo-oscillator is exposed to them in like manner as the aperture 25 and the light-conducting fibre, respectively, but only movements of this component relative to the piezo-oscillator 15 enter into the measurement result.

The freely movable measuring device 7, disposed at the soil 5, comprises a light emitter 31, which as light source preferably possesses a Laser as well as a modulating device, which is switchable on and off, for the light bundle 32 emitted by the Laser. This light bundle 32 is made parallel with the aid of an optical unit illustrated schematically as single lens 33 and leaves the measuring device 7 through a semi-permeable mirror 34, which is without function for the emitted light bundle.

The light bundle 32 emitted by the Laser is focussed through the lens 29 surrounded by a scatter light protection 36, through a semi-permeable coupling-out mirror 35 and by way of the deflecting mirror 28 onto the aperture opening 26 and the reflecting layer 22 disposed therebehind. The cross-section of the focal spot is so chosen that it is somewhat larger than the aperture opening 26 so that a part of the light also impinges onto a reflecting layer 37, which surrounds the aperture opening 26 on that side of the aperture 25, which faces the deflecting mirror 28 and thereby the light emitter 31. The reflecting layers 37 and 22 are for the sake of clarity reproduced with a strongly enlarged thickness in the Figures, in which they are represented in side elevation. In practice, evaporated-on reflecting layers are preferably employed here.

The parallel light bundle 30 projected back by the lens 29 to the measuring device 7 is deflected by the deflecting mirror 34 to a lens 39, which images it on a photo-electric receiver 40, the output signal of which is conducted through a line 41 to an evaluating and indicating circuit 42.

That part of the light bundle 32, which is coupled out by the semi-permeable deflecting mirror 35 in the sensor unit 3, impinges on a photo-diode 45, the one terminal of which stands in connection through a protective resistor 44, a capacitor 46 suppressing direct voltage components and an conducting sleeve 47 with the high voltage conductor 1, whilst its other terminal is conductively connected with the electrode 10.

The photo-diode 45, its protective resistor 44 and a capacitor 46 are illustrated in FIG. 1 only for the sake of clarity outside the intermediate space between the high voltage conductor 1 and the electrode 10. In practice, one will house these electronic components just as the mirror 35, which then lies in the ray path behind the deflecting mirror 28, in the free space between high voltage conductor 1 and electrode 10 in order to be able to use the shortest possible, rectilinear conductors extending along the field lines and largely to reduce the occurrence of corona discharges. In a given case, one can then also dispense with the additional sleeve 47 and produce the second conducting connection of the photo-diode 45 with the oscillator 15 by way of the sleeve 20.

In the following description of the manner of operation of the device according to the invention, it is presupposed that sensor units 3 are firmly installed at high voltage conductors 1, for example the wires of overland lines, at places, at which the voltage shall be measured or the presence or absence of voltage shall be checked. For the performance of such a measurement, the measuring device 7 is so positioned on the soil below the corresponding sensor unit 3 that the light bundle 32 emitted by it impinges perpendicularly upwards on the lens 29 of the sensor unit. In order to be able to undertake a corresponding positioning, the measuring device 7 can be arranged on a pivotable stand or be provided with vertically displaceable legs or the light emitter 31 can be cardanically suspended in the measuring device so that the direction of the light bundle 32 can always be brought into agreement with the vertical. Furthermore, the measuring device 7 can comprise a likewise not illustrated target telescope, with the aid of which an exact taking of bearings on the sensor unit 3 is made possible.

When the measuring device 7 has been brought into the correct setting, then the light emitter 31 is at first caused to emit a non-modulated light bundle 32, which is deflected in the already described manner by way of the projection device consisting of the lens 29 and the deflecting mirror 28 onto the aperture opening 26 and the reflecting layer 22 lying therebehind at the free end 21 of the piezo-oscillator 15.

When an alternating voltage is present at the high voltage conductor 1, then the free end 21 of the piezo-oscillator 15 oscillates up and down as already mentioned so that the aperture opening 26 is illuminated with correspondingly fluctuating brightness by the light reflected from the mirror surface 22. Since the aperture opening 26 is imaged by way of the deflecting mirror 28, the lens 29, the deflecting mirror 34 and the lens 39 onto the photo-electric receiver 40, these brightness fluctuations, the amplitude of which is proportional to the voltage present at the high voltage conductor 1, lead to corresponding fluctuations of the output signal of the photo-electric receiver 40. The magnitude of the amplitude of this output signal is initially measured and stored by the evaluating and indicating unit 42.

Since, as already mentioned, the cross-section of the focal spot of the light bundle 32 is so chosen that also a part of the mirror surface 37 surrounding the aperture 26 is illuminated, the light projected onto the photo-receiver 40 contains a constant light component, since the aperture 25 is arranged stationarily. The brightness of this constant light component depends on the transparency of the entire measurement path, which can for example be influenced by icing, misting or pollution of the lens 29, the deflecting mirror 28 or of the reflecting layer 22 as well as by different moisture content of the air column disposed in the measurement path between the measuring device 7 and the sensor unit 3. All these influences can be eliminated with the aid of the constant light component received by the photo-electric receiver 40 thereby, that one either measures the constant light component and with the aid of this measurement value corrects the measured alternating light amplitude or that the constant light component is used for an intensity regulation of the light bundle 32 emitted by the light emitter 31.

After storage of the thus corrected amplitude value of the oscillation, forced by the high voltage alternating field, of the sensor at 50 Hertz or 60 Hertz, in place of the unmodulated measurement light, a light bundle is projected from the measuring device 7 to the sensor unit 3, which light bundle is modulated in brightness by a signal, the frequency of which corresponds to the resonant frequency of for example 1500 Hertz of the oscillator circuit which is formed from the photo-diode 45 with the piezo-oscillator 15 by way of the impedances of the connecting lines and the capacitance between electrode 10 and high voltage conductor. This excitation signal gets by way of the semi-permeable coupling-out mirror 35 onto the photo-voltaicly operating photo-diode 45. Hereby, an additional oscillation at the correspondingly high frequency of 1500 Hertz is impressed on the piezo-oscillator 15 and leads to an additional modulation of the reflected light bundle 30. If one switches the excitation signal off and again sends unmodulated light, then the piezo-oscillator 15 oscillates with reducing amplitude in a damped oscillation and the corresponding signal delivered by the receiver 40 can, by reason of its frequency differing greatly from the frequency of the high voltage alternating field, be readily filtered out electrically and processed separately. Initially, its amplitude can by reason of the already obtained constant light component be freed from the influences of the air transparency and similar and the thus corrected amplitude can be used to eliminate the temperature dependence of the actual measurement light signal, because the temperature of the piezo-oscillator 15 influences both the oscillations in corresponding manner.

Thus, possibly with the aid of previously obtained calibration values, the alternating output signal of the receiver 40 obtained with the unmodulated emitted light bundle lets itself be so corrected that it represents an exact indication of the voltage present at the high voltage conductor 1.

If the light reflected from the sensor unit 3 on the emission of an unmodulated light bundle to the photo-electric receiver 40 contains no alternating light component, then this can mean that either no high voltage is present at the high voltage conductor 1 or that the sensor unit 3 is defective. In order to be able to distinguish between both these cases, the just described excitation signal is again emitted, which when the sensor unit 3 functions unobjectionably excites the piezo-oscillator 15 to a corresponding resonant oscillation so that a high frequency modulated reflection signal can be received. Here, too, the possibility exists of switching the light emitter 31 very rapidly from the emission of modulated light to the emission of constant light and to observe the modulation of the light reflected from the sensor unit 3 due to the piezo-oscillator 15 still oscillating somewhat after the photo-diode 45 is no longer excited further.

In each case, it lets itself be decided unambiguously in this manner whether the sensor unit 3 is functionally capable or not.

This possibility of checking consists also when, instead of the mechanical piezo-oscillator 15, another sensor, for example a PLZT-platelet is used, which changes its light permeability or its scatter behaviour in dependence on the surrounding alternating field and behind which (seen in direction of the incident light bundle 32) a mirror is mounted. In this case, care must be taken through an appropriate electrical wiring that altogether one obtains a system capable of oscillation and excitable into a self-oscillation through the photo-diode 45.

In FIG. 3, only one clamped-in piezo-oscillator 15 and the aperture 25 arranged in front of its free end face is illustrated in a view corresponding to that of FIG. 1, however greatly enlarged. In this variant, the arrangement is so designed that the longitudinal central axis of the sensor 15 in its rest position is exactly aligned with the optical axis of the projection equipment indicated by the double arrow 50. The aperture 25 is so arranged that the centre of its slit 26 co-incides with the optical axis 50. The height of the slit 26 is in that case greater than the maximum total deflection (upwardly and downwardly) of the free end 21 of the piezo-oscillator 15. In this arrangement, a radiated-in light bundle is modulated in brightness at twice the frequency of the high voltage alternating field, because a maximum brightness results in the rest or centre position, which is illustrated in FIG. 3 and corresponds to the zero transition of the high voltage alternating field, and a brightness minimum is passed through each time on a deflection upwardly (for example maximum of the high voltage alternating field) as well as also on a deflection downwardly (for example minimum of the high voltage alternating field). In the illustrated embodiment, the brightness modulation of the radiated-in light bundle is effected substantially through the tilting of the reflecting layer 22 extending perpendicularly to the optical axis 50 in the drawn rest position.

If one wants to avoid the above-described frequency doubling, then the variant illustrated in the FIGS. 4 and 5 can be chosen. Here, the reflecting layer, in the direction of movement of the piezo-oscillator characterised by a double arrow F, possesses a height h, which is about equal to twice the maximum deflection of the free end 21 of the piezo-oscillator 15 in the case of nominal voltage at the high voltage conductor 1. In the FIGS. 4 and 5, the rest or zero transition setting is again illustrated, in which in this embodiment the lower half of the reflecting layer 22 is covered by the lower part of the aperture 25 and the upper half, which is aligned with the lower half of the aperture opening 26 likewise possessing the height h, of the reflecting layer 22 reflects light to the measuring device 7. If a positive half wave of the high voltage follows this state, then the free end 21 of the piezo-oscillator 15 moves upwardly, whereby an ever larger part of the upper half of the aperture opening 26 is covered by the reflecting layer 22 until finally the entire aperture opening 26 is filled by the reflecting layer 22 on the attainment of the maximum positive voltage amplitude.

The reflecting layer 22 is so inclined through an angle α relative to the direction perpendicular to the longitudinal axis of the piezo-oscillator 15 that it stands perpendicularly upwards on the optical axis 50 on maximum deflection. Thus, the entire light falling on the aperture opening 26 is reflected to the measuring device and this receives the maximum brightness. If, thereagainst, a negative voltage half wave follows on the state shown in FIG. 4, then the reflecting layer 22 is moved downwardly so that its part effective through the aperture opening 26 becomes ever smaller until it finally has disappeared completely from the aperture opening 26 on the attainment of the maximum negative voltage amplitude. In this setting, no more of the light falling on the opening 26 is reflected to the measuring device. This then results in the minimum brightness receivable at the measuring device 7. If the piezo-oscillator 15 executes a periodic oscillation by reason of a periodic high voltage alternating field, then the light reflected from the reflecting layer 22 is thus periodically modulated in its brightness in corresponding manner.

Instead of inclining the mirror surface 22 at an angle α in the manner shown in FIG. 4, it is according to the invention also possible, as illustrated in FIG. 3, to align it perpendicularly to the longitudinal axis of the piezo-oscillator 15 and instead thereof so to clamp the piezo-oscillator mechanically at 17 that its longitudinal axis in the rest or zero transition setting is inclined at an appropriate angle to the optical axis 50 so that the reflecting layer 22 again assumes the position illustrated in the FIG. 4.

A further variant suitable particularly for the measurement of direct voltages is illustrated in the FIGS. 6a and 6b, wherein FIG. 6a corresponds to the illustrations in the FIGS. 3 and 4 and FIG. 6b shows the end face of the free end 21 of the piezo-oscillator 15, as it appears seen from the right in FIG. 6a with the aperture 25 omitted. This variant distinguishes itself from the variants suitable for alternating voltage substantially in that the aperture 25 displays two slits 26 and 26', which are arranged at a spacing each from the other in direction of movement of the piezo-oscillator 15 and are separated by a web 51, which in the rest position of the piezo-oscillator 15, i.e. when no high voltage is present, covers the end face of the free end 21. The width of the slits 26 and 26' is so chosen that, in the presence of nominal voltage, they come into congruency with the end face of the then maximally deflected piezo-oscillator 15, wherein the one slit serves for the recognition and measurement of a positive and the other for the recognition and measurement of a negative direct voltage. In order to be able to distinguish both these voltages signs each from the other, two light-conducting fibres 52 and 53 are provided, the end faces of which lie opposite the slits 26' and 26, respectively. In order also here to come to a maximum brightness on maximum deflection, the end face of the free end 21 is subdivided into two halves which each carry a respective reflecting layer 22 and 22', respectively, which are so inclined in different manner that the one on the upward deflection and the other on the downward deflection stands perpendicularly to the respective optical axis. A corresponding effect can also be attained thereby, that only a single mirror surface 22 is provided, which is perpendicular to the longitudinal axis of the piezo-oscillator, and both the optical axes are inclined through an appropriate alignment of the light-conducting fibres 52 and 53. Here, the reflecting layer 37, which in the variants serving for the alternating voltage measurement is mounted on the aperture 25 according to the FIGS. 3 to 5, is omitted because the constant light component reflected by this reflecting layer can not be separated from the light reflected by the reflecting layers 22 or 22', if a still further light-conducting fibre is not to be used or the measures are taken, which are explained further below with reference to the FIGS. 14, 15 and 16.

FIG. 7 shows a view, corresponding to that of the FIG. 2, of another embodiment of a sensor unit 3 according to the invention, wherein the protective housing 9 is omitted and like parts are provided with the same reference symbols. For the avoidance of repetitions, these already described parts are not explained once again, but only the differences are entered into.

The sensor unit shown in FIG. 7 is pluggable onto the high voltage conductor 1 for the performance of a measurement and can thereafter again be pulled off. For this purpose, the hollow cylindrical electrode 10 is provided at its upper side along an envelope line with a slot 55 extending over its entire axial length. The vertical spacer piece 14, illustrated in FIG. 2, is omittd here. Instead thereof, a spacer piece 56 or 57 extends from each of the slot edges radially inwards to the sleeve 13, which is here constructed in the shape of an upwardly open C-shaped clip, the ends of which pass over into the spacer pieces 56 and 57, respectively. In this manner, an upwardly open insertion path 58 is created, into which the high voltage conductor 1 can be introduced on the plugging-on of this sensor unit 3 in direction of the arrow G. If the sensor unit 3 is pressed upwardly hereon against the high voltage conductor 1, then the electrode 10, the spacer pieces 56 and 57 and the sleeve 13 spring elastically apart, whereby the high voltage conductor 1 can slide relative to the sensor unit 3 downwardly into the central passage of the sleeve 13. When it has attained the setting reproduced in FIG. 7, then the insertion path 58 again narrows to its original width and a detent effect occurs, because the width of the upward opening of the C-shaped sleeve 13 is somewhat smaller than the diameter of the high voltage conductor 1. Since at least two electrode holders 12 constructed in that manner are provided in a sensor unit 3 according to the invention and arranged so spaced in axial direction each from the other as is illustrated in FIG. 1 for the electrode holders 12, there results a firm seating of the sensor unit 3 on the high voltage conductor, which seating assures that the electrode 10 assumes a defined spacing from the high voltage conductor 1 during the measurement. Beyond that, the illustrated C-shaped sleeve 13 is in this embodiment produced of electrically conducting material so that it serves at the same time for the connection of the sensor 15 and the here not illustrated photo-diode (and its associated circuit elements) with the high voltage conductor 1.

This embodiment can also find use for a subsequent, permanent mounting of the sensor unit in spaces, in which no danger of pollution exists.

Illustrated in FIG. 8 is an embodiment of the sensor unit 3 according to the invention, in which the reference electrode is formed by an auxiliary conductor 87, which is constructed substantially in U-shape and at the ends of both its limbs carries a respective metallic clip 88, with the aid of which it can be so plugged onto the high voltage conductor 1 that the part extending between both the limbs extends substantially parallelly to the high voltage conductor. The curvatures, with which this part passes over into both the limbs, can in accordance with the voltage present at the high voltage conductor 1 extend substantially more flatly than this is illustrated in FIG. 8, in order to avoid corona discharges. The contact between the clips 88 and the high voltage conductor 1 is not critical, because it serves substantially only for the transmission of potential and the power taken up from the high voltage conductor 1 by the sensor unit 3 is extra-ordinarily small.

Since the sensor unit 3 illustrated in FIG. 8 is intended for a subsequent, permanent mounting at high voltage conductor in the open, the protective housing 9 is according to the invention so constructed that it can not by reason of pollution come to a displacement of the potential of the high voltage conductor 1 and of the auxiliary conductor 87 on the housing surface and thereby to a falsification of the measurement result. According to the invention, also the housings indicated only schematically in the FIGS. 1, 2 and 10 can be so constructed as is illustrated in detail in the FIG. 8.

The housing 9 shown here possesses substantially the shape of a hollow circular cylinder which is arranged concentrically with the auxiliary conductor 87. In axial direction, the interior space of the housing 9 is closed off by two end walls 60 and 61, which in their centre display passage openings 62 and 63, through which the auxiliary conductor 87 is led in hermetically tight manner. Thus, the auxiliary conductor 87 carries the housing 9 by way of the end walls 60 and 61 in an exactly defined position. The cylinder wall of the housing 9 protrudes outwardly in axial direction beyond the end walls 60 and 61 and at both ends possesses radially protruding projections 64 and 65, which extend in circumferential direction on its radially outer as well as also on its radially inner surface and which are separated each from the other in axial direction by grooves or depressions 66 and 67 likewise extending in circumferential direction around the entire housing. Also the projection 65, which is directed radially inwards and lies in axial direction each time nearest to the end wall 60 and 61, respectively, is separated by a circumferentially extending groove 68 from the respectively neighbouring end wall 60 or 61. Through this arrangement, it is prevented that a contiguous dirt or moisture film starting from the auxiliary conductor 87 can extend up to the externally disposed shell surface 79 of the housing 9 and thereby distort the potential distribution, to which the electrode 10 is exposed.

In the example of embodiment reproduced in FIG. 8, the electrode 10 does not form a closed hollow body, but possesses the shape of an upwardly open trough, which is suspended below the auxiliary conductor 87 at the electrode holders 12 and the cross-sectional configuration of which is adapted to the course of an equipotential surface to be scanned here. Since in the space region lying between the high voltage conductor 1 and the auxiliary conductor 87, it comes to a distortion of the field otherwise radially symmetrically surrounding the high voltage conductor 1, the electrode 10 is here according to the invention constructed in the just described manner departing from the semi-circularly cylindrical shape, for which its exact shape must be ascertained through appropriate trials, in which the course of the equipotential surfaces is previously determined in the individual case.

The sensor 15, the aperture 25 and the photo-diode 45 with its accessory components are arranged in the interior of the electrode 10, illustrated not sectioned in FIG. 8, as was already described above. Since also the shell surface 79 of the housing 9 does not extend along an equipotential surface, it must be prevented that the potential is dragged through pollution or moisture from the upper side of this shell surface 79 facing the high voltage conductor 1 to the underside facing the soil. For this purpose, projections and depressions lying therebetween, which are not illustrated in FIG. 8, extend on the outside of the housing parallelly to the longitudinal axis of the housing 9 in the manner that they "insulate" the upper housing half from the lower.

Illustrated in FIG. 9 is a view of a fourth embodiment corresponding to that of FIG. 2, in which again like parts are designated by the same reference symbols. Since a sensor unit 3 firmly to be mounted at the high voltage conductor 1 is again concerned in this case, the electrode 10 forms a closed hollow cylinder, in the interior of which is arranged a second electrode 70, here forming the reference electrode, in the shape of a hollow circular cylinder concentric with the high voltage conductor 1. The metallic electrode 70 extends along an equipotential surface of the field surrounding the high voltage conductor 1 and is constructed to be shorter in axial direction than the externally disposed electrode 10 in order to avoid a screening effect. Both the electrodes are held at a spacing each from the other by radially extending, insulating spacer pieces 14'. The inner electrode 70 is again connected by way of radially extending spacer pieces 14 of insulating material with a sleeve 13 fastened at the high voltage conductor 1. In this arrangement, the sensor 15 is disposed between the inner electrode 70 and the outer electrode 10 and taps off the voltage, which drops across both these electrodes and which it translates into an influencing of the radiated-in light bundle.

This embodiment, too, can be so modified that it is pluggable onto the high voltage conductor 1 only for the performance of a measurement and can thereafter again be drawn off.

The embodiments illustrated in the FIGS. 1, 2, 7, 8 and 9 are particularly suitable for great to very great high voltages, because they make possible an extremely short line conduction due to their build-up and all employed conductors with the exception of the terminals 18 and 19 extend along equipotential surfaces so that the occurrence of corona discharges is reduced to a minimum. The outwardly insulated conductors 18 and 19, too, traverse only a small potential gradient, since they are according to the invention constructed to be as short as possible. It is expressly pointed out that the parts 28 and 29 of the projection arrangement, the aperture 25 with the aperture opening 26 and the reflecting layer 37, the coupling-out mirror 35 and the photodiode 45 with its wiring 44 and 46, which are illustrated in FIG. 1 for the first example of embodiment, are provided and arranged in corresponding manner in the examples of embodiment according to FIGS. 7 and 9.

These components of the sensor unit are, as is evident from the FIG. 10, provided also in a further embodiment which differs from the previously described examples substantially through a different spatial arrangement of the piezo-oscillator 15 with respect to the electrode 10.

In this embodiment, a layer 72 of insulating material is applied, for example wound, in immediate contact on the high voltage conductor 1 and surrounds the high voltage conductor 1 concentrically. Applied in direct contact on the outside of this insulating layer 72 is the electrode 10 of conducting material, which is held at a defined spacing from the high voltage conductor 1 by the insulating layer. Here, too, the electrode 10 possesses the shape of a hollow cylinder of circular cross-section and extends along an equipotential surface of the field surrounding the high voltage conductor 1. Since the intermediate space between the high voltage conductor 1 and the electrode 10 is here filled out completely by the insulating layer 72, the piezo-oscillator 15 is arranged externally of this intermediate space, however mechanically firmly clamped in the proximity of its one end 16 in the manner already described in connection with the example of embodiment according to FIG. 1 and electrically conductively connected with the high voltage conductor 1 on the one hand and with the electrode 10 on the other hand. This embodiment is particularly suitable for medium high voltages up to about 50 kilovolts.

It is possible also in this manner of arrangement to provide a second electrode 70, which then can for example be wound on the high voltage conductor 1 likewise subject to interposition of an insulating layer. In that case, a concentric arrangement to the electrode 10 can be chosen. Alternatively, it is possible to arrange the electrode 10 and the electrode 70 at a mutual axial spacing, as can also occur in the example of embodiment according to FIG. 9.

Figure 11:
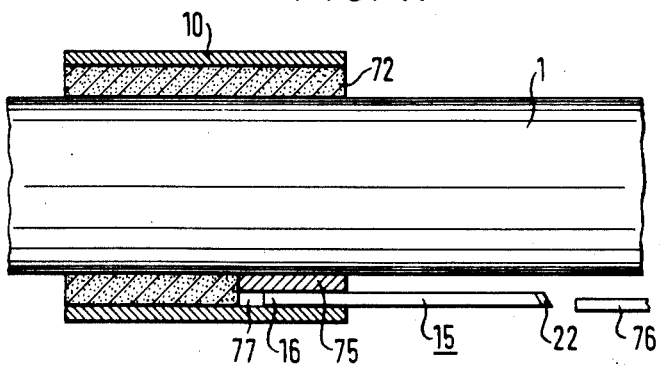

A further embodiment is illustrated in FIG. 11, in which the piezo-oscillator 15 is mechanically clamped and at the same time electrically connected at its one end 16 between the electrode 10 and a contact piece 75 lying directly against the high voltage conductor 1. Provided here, too, between electrode 10 and high voltage conductor 1 is again an insulating layer 72, which in its lower region displays a recess 77, in which the contact piece 75 and the clamped end 16 of the piezo-oscillator 15 are housed. In this case, the light bundle to be modulated is preferably radiated in by way of a light-conducting fibre 76, which is likewise fastened at the high voltage conductor 1, onto the mirror surface 22 and again guided back after reflection has taken place.

All previously described examples of embodiment have the advantage in common that the sensor unit comprises only components which are favourable in costs and can readily be firmly installed at points of interest in high voltage systems. All parts entailing higher manufacturing costs are comprised in the measuring unit 7, which is independent of the individual sensor unit 3 and can be taken along from place of use to place of use. Since the information exchange between measuring unit 7 and sensor unit 3 in each case only takes place with the aid of light, an absolute contact safety is given.

Thereagainst, an embodiment of the measuring arrangement according to the invention is illustrated in FIG. 12, in which the measuring device 7 and sensor unit 3 are connected each with the other through a rod 90, which is of insulating material and the length of which is so chosen that the one end 91, in the proximity of which the measuring device 7 is arranged, can be gripped free of danger by an operating person, whilst the auxiliary conductor 89, which projects out of the other end 92 of the rod 90, can be brought into galvanically conducting contact with the high voltage conductor 1.

As indicated by the dashed line in FIG. 12, the sensor unit 3 is arranged in the interior of the hollow rod 90 in the proximity of the end 92 lying remote from the measuring device 7 and connected with the measuring device 7 through a light-conducting fibre 94, which extends in the interior of the rod 90 and by way of which the information exchange between measuring device 7 and sensor unit 3 takes place in the above-described manner. In the case of the example of embodiment shown in FIG. 12, the free end of the auxiliary conductor 89 is constructed in the shape of a hook 95 so that the rod 90 can be hooked at the high voltage conductor 1. The hook 95 is rounded off at all sides in order to prevent the occurrence of corona discharges.

The upper end 92 of a rod 90 of that kind is illustrated to enlarged scale and partially cut open in FIG. 13. The free end of the auxiliary conductor 89 here possesses no hook shape, but displays a groove-shaped depression 97, which is adapted to the shape of the high voltage conductor 1 and facilitates a pressing of the auxiliary conductor 89 to the high voltage conductor 1 in an exactly defined position. Here, too, the auxiliary conductor 89, otherwise constructed as circularly cylindrical rod, displays no kind of sharp edges.

Apart from the different construction of the free end of the auxiliary conductor 89, the measuring arrangements of the examples of embodiment shown in the FIGS. 12 and 13 possess an identical build-up.

As is particularly evident from the FIG. 13, the electrical potential present at the high voltage conductor 1 is drawn into the interior of the rod 90 due to the fact that the auxiliary conductor 89 is brought into galvanically conducting contact with the high voltage conductor 1. In that case, the length of the auxiliary conductor 89 is so chosen that an unambiguous potential course, undisturbed by external influences, results around its lower, semi-spherically constructed end 98 and the equipotential surfaces surrounding the lower end 98 of the auxiliary conductor 89 possess about spherical calotte shape in the immediate neighbourhood of the longitudinal axis of the auxiliary conductor 89. At least, these equipotential surfaces are so smoothly formed in this region that an electrode 10 can readily be adapted in its shape to the course of these equipotential surfaces. Here, too, the electrode 10 is so fastened by way of an insulating layer 72 directly at the auxiliary conductor 89 that it assumes an exactly defined position in the high voltage field so that a voltage, which is proportional to the high voltage, drops between the electrode 10 and the auxiliary conductor 89.

The sensor 15, constructed also here as rod-shaped piezo-electric oscillator, is as for the other embodiments mechanically clamped in the proximity of its one end 16 and galvanically connected respectively by way of the line 19 with the electrode 20 as well as by way of the line 18 and the sleeve 20 with the auxiliary conductor 89. Lying opposite that free end 21 of the sensor 15, which carries a reflecting layer 22, is similarly as in FIG. 11 the free end of the light-conducting fibre 94, with the aid of which the measuring light radiated out from the measuring device 7 can be steered onto the reflecting layer 22 and the light reflected from the reflecting layer 22 again be conducted back to the measuring device 7.

Reproduced in schematic manner in FIG. 14 is the electrical circuit diagram of a sensor unit 3, which apart from the oscillatory system shown in the FIGS. 1 and 10 comprises a zero-point circuit arrangement 100, with the aid of which the sensor 15 can be caused independently of the voltage present at the high voltage conductor 1 to deliver signals, from which its zero-point position lets itself be derived, which corresponds to the voltage-free state of the high voltage conductor 1.

For this purpose, a controllable switch arrangement, which consists of two semi-conductor switches 103 and 104 lying in series each with the other and a current-limiting resistor 106, is provided in parallel with the sensor 15, i.e. between the high voltage conductor 1 and the electrode 10 extending along an equipotential surface. Each of both the semi-conductor switches 103 and 104 possesses a diode characteristic, i.e. it is always closed in conducting direction and can be either opened or closed only in blocking direction in dependence on the control signal at its control input. Both the semi-conductor switches 103 and 104 are so arranged that their conductive directions are opposed each to the other as is indicated by both the arrows beside the semi-conductor switches. Thus, in the rest state, i.e. when both semi-conductor switches 103 and 104 are opened, no current can flow between the high voltage conductor 1 and the electrode 10 by way of this path. A voltage present between the high voltage conductor 1 and the electrode 10 is fully present at the sensor 15 and influences its deflection out of the rest position.

Both the control inputs of the semi-conductor switches 103 and 104 are connected each with the other through a line 105 so that both the semi-conductor switches 103 and 104 are always closed or opened together. The former occurs thereby, that a voltage differing from zero is applied between the line 105 and a line 107, which connects the current paths of both the semi-conductor switches 103 and 104 each with the other. If, thereagainst, no voltage is present between both the lines 105 and 107, then both semi-conductor switches 103 and 104 are opened. Through this arrangement, it is possible in spite of the diode characteristic of the semi-conductor switches 103 and 104 to short-circuit direct voltages between the high voltage conductor 1 and the electrode 10 or to let them drop pin-pointedly across the sensor 15 independently of their polarity. Since the voltage source formed by the high voltage conductor 1 and the electrode 10 is of very high resistance, only a very small current flows in the case of such a short-circuit through the controllable semi-conductor switches 103 and 104 and is beyond that limited by the resistor 106 to a non-critical value.

If both the semi-conductor switches 103 and 104 are closed by the application of an appropriate voltage between the lines 105 and 106, a direct or alternating voltage present between the high voltage conductor 1 and the electrode 10 thus collapses and the sensor 15 passes into its zero position. This is particularly of significance when the presence of a direct high voltage between the high voltage conductor 1 and the electrode 10 shall be ascertained with the aid of the sensor 15. Although such a direct voltage deflects the sensor 15 likewise out of its zero position, which leads to a variation, for example, of the brightness of a light bundle radiated in from the measuring device 7 onto the mirror surface 22 of the sensor 15 and reflected from this mirror surface 22 to the measuring device 7, this alteration can however be used as measure of the magnitude of this direct voltage only when the zero-point position of the sensor 15 and the brightness, present at the measuring device 7 for this zero-point position, of the reflected light bundle are known.

The measurement of such a direct voltage is of significance not only when the high voltage conductor 1 always conducts a direct high voltage, but also when an alternating voltage normally drops across the high voltage conductor 1. Even on the switching-off of this alternating voltage, for example in the case of a free line, appreciable direct voltages can namely be induced in the high voltage conductor 1, the presence of which voltages must be ascertained since they make a touching of the high voltage conductor extraordinarily dangerous.

A photo-diode 108, a capacitor 109 and a resistor 110 are associated as control circuit with the controllable semi-conductor switches 103 and 104 illustrated in FIG. 14. In that case, the capacitor 109 and the resistor 110 are connected in series each with the other and the series connection thus formed lies in parallel with the photodiode 108. Both the ends of the resistor 110 are electrically connected with the lines 105 and 107, respectively, so that the voltage dropping across the resistor 110 serves as control signal for both the semi-conductor switches 103 and 104. A light bundle can be deflected by way of a mirror 111 onto the photo-diode 108 and is conducted from the measuring device 7 to the sensor unit 3 independently of the light bundle which is conducted as measurement light bundle to the reflecting layer 22 of the sensor 15 or as excitation signal to the photo-diode 45.

The zero-point circuit arrangement 100, illustrated in FIG. 14, possesses the great advantage that it needs no individual current or voltage supply, since it obtains the energy required for its operation from the light bundle that is radiated onto the photo-voltaically operating photo-cell 108. Thus, the zero-point circuit arrangement 100 can operate independently of whether a voltage is present or not at the high voltage conductor 1.

This occurs in the following manner: If no light falls on the photo-diode 108, then the capacitor 109 is uncharged and no current flows through the resistor 110 so that no voltage is present between the lines 105 and 107. The semi-conductor switches 103 and 104 are thus opened and the sensor 15 can react unhindered to a voltage between the high voltage conductor 1 and electrode 10.

If, thereagainst, a constant light bundle is directed onto the photo-diode 108, then it produces a photo-current, through which the capacitor 109 is charged by way of the resistor 110. The current, which during the charging process flows through the resistor 110, generates across the resistor 110 a voltage drop which suffices to close both the semi-conductor switches 103 and 104. Thereby, a voltage present between the high voltage conductor 1 and the electrode 10 collapses and the sensor 15 goes over into its zero position.

However, this state remains maintained even in the case of continuing constant light radiation of the photo-diode 108 only until the capacitor 109 is fully charged. Then, no more charging current flows and also no voltage any longer drops across the resistor 110. The switches 103 and 104 are thus again opened after a certain time $\tau_1$, although constant light continues to fall on the photo-diode 108. If the constant light is again switched off, then the capacitor discharges by way of the resistor 110. The voltage in that case dropping across the resistor 110 however has a sign, which is opposite to the sign of the voltage during the charging process so that the switches 103 and 104 remain opened.

If a sensor unit 3 comprises, as is illustrated in FIG. 14, a resonant oscillatory system 15, 44, 45 and 46, which is impulsable into resonant oscillations through an excitation signal, as well as also a zero-point circuit arrangement 100, then not only the presence of an alternating or direct voltage between the high voltage conductor 1 and the electrode 10 can be ascertained thereby, but also the functional capability of the sensor 15 as well as also of the resonant system and also of the zero-point circuit arrangement can be tested.

The checking of the functional capability of the sensor and of the resonant system through radiation of a light bundle modulated at the resonance frequency onto the photo-diode 45 was already described. In the following, the testing of the functional capability of the zero-point circuit arrangement shall be explained. This testing is required for the following reason: If a constant light bundle is directed onto the mirror surface 22 of the sensor 15 by way of the mirror 28, then this means (presupposing the functional capability of the sensor 15) only that no alternating voltage is present between the high voltage conductor 1 and the electrode 10. A possibly present direct voltage can be recognised only thereby, that the sensor 15 on the closing of the semi-conductor switches 103 and 104 passes out of a deflected position, which can be brought about by the direct voltage, into its zero position. This can be recognised thereby, that the brightness of the measuring light bundle radiated in and reflected by way of the mirror 28 temporarily changes when a constant light bundle is directed onto the photo-diode 108. When such a brightness variation of the reflected measuring light bundle does however not occur, then this can either be due to the absence of a direct voltage or to a defect of the zero-point circuit arrangement. In order to be able to distinguish between both these cases, a constant light bundle is at first directed from the measuring device 7 by way of the mirror 111 onto the photo-diode 108, whereby the switches 103 and 104 are closed for the time span $\tau_1$. If the measuring device 7 during this time span $\tau_1$ sends a light bundle modulated at the resonance frequency to the photo-diode 45 and the mirror surface 22 of the sensor 15, then the sensor 15 can not be excited into resonant oscillations, since it is short-circuited by way of the switches 103 and 104. If the modulated light bundle is switched over to constant light during the time $\tau_1$, then no continued oscillation of the sensor 15 may thus be recognisable in the light reflected from the mirror surface 22, when the zero-point circuit arrangement is functionally capable. Should such a continued oscillation however occur, then this means that either the control circuit 108, 109 and 110 or the controllable switches 103 and 104 are defective and no certain statement about the presence or absence of a direct voltage between high voltage conductor 1 and electrode 10 is possible. The same applies also when a light bundle modulated at resonance frequency is directed onto the photo-diode 45 for the testing of the sensor 15 and no continued oscillation of the sensor 15 is ascertainable on the switching of this light bundle over to constant light, although no constant light bundle is directed onto the second photo-diode 108 and the switches 103 and 104 would thus have to be open.

Illustrated in FIG. 15 is a somewhat different zero-point circuit arrangement, which comprises two double-pole change-over switches 113 and 114, of which the one is connected in the line 18 and the other in the line 19 so in series with the sensor 15 that in the rest state, reproduced in FIG. 15, the terminal 15a of the sensor 15 is connected with the high voltage conductor 1 and the terminal 15b with the electrode 10. In the switched-over state, thereagainst, the terminal 15a is connected with the electrode 10 and the terminal 15b with the high voltage conductor 1. If therefore a direct voltage, which deflects the sensor 15 out of its zero position to one side, is present between the high voltage conductor 1 and the electrode 10, then the sensor 15 is reversed in polarity with respect to this direct voltage through actuation of the change-over switches 113 and 114, which leads to a corresponding deflection in the other direction.

Both the change-over switches 113 and 114 are driven from the Q-output or the $\overline{Q}$-output of a monostable oscillator 117 by way of an individual delay member 115 and 116, respectively. The trigger or pulse input of the monostable oscillator 117 is connected by way of a line with the connecting line between the photo-diode 45 and its load resistor 44, which is indicated only symbolically in FIG. 15.

Both the delay members 115 and 116 possess a different delay time. If the delay member 115 for example displays a delay time $\tau_2$, then the delay member 116 possesses a somewhat greater delay time, which is for example equal to $\tau_2 + \delta$.

The function of this zero-point circuit arrangement is explained in the following with reference to the signal diagram reproduced in FIG. 16.

Figure 16:
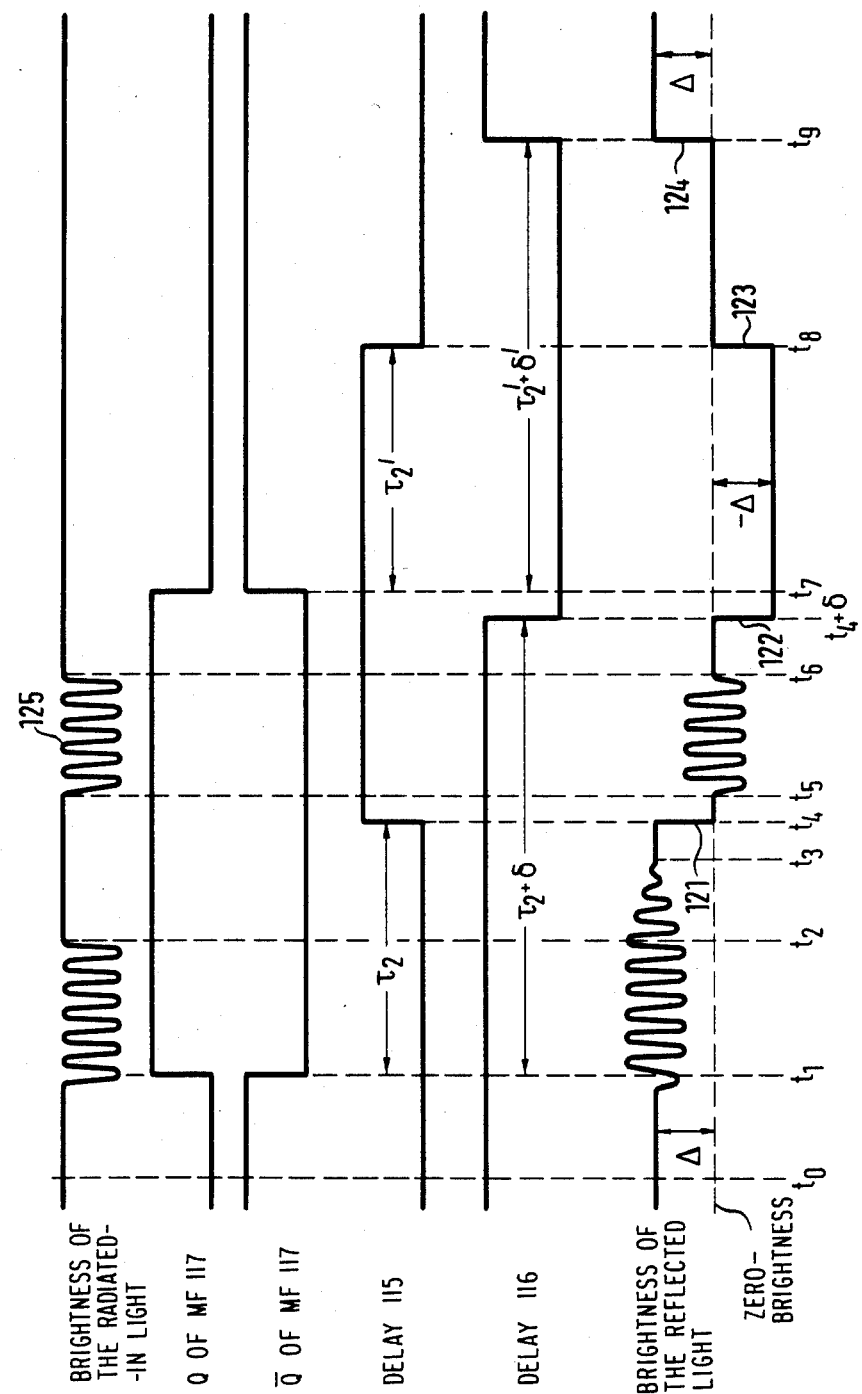

It is in that case assumed initially that both the change-over switches 113 and 114 are disposed in the position illustrated in FIG. 15 and that a constant light signal, the brightness of which is reproduced in the uppermost line of FIG. 16, is radiated onto the sensor 15 at the time $t_0$ to the extreme left. If a direct voltage is present between the high voltage conductor 1 and the electrode 10, then the sensor 15 is hereby deflected out of its zero position and the light reflected to the measuring device 7 possesses a brightness which is different from the brightness which corresponds to the zero position, as is symbolised by the deviation $\Delta$ in the lowermost line of FIG. 16. The magnitude of this deviation is initially not known. In order to ascertain this magnitude and at the same time to test the functional capability of the entire circuit arrangement illustrated in FIG. 15, the measuring device 7 at the instant $t_1$ goes over to the delivering an alternating light signal instead of the constant light signal. The frequency of this alternating light signal is equal to the resonance frequency of the oscillatory system which is formed by the photo-diode 45, the resistor 44, the capacitor 46, the high voltage conductor 1, the line 18, the sensor 15, the line 19 and the electrode 10. By reason of this excitation signal, which is reproduced in the uppermost line in FIG. 16, the sensor 15 is caused into a resonant oscillation which additionally modulates the brightness of the light bundle sent back to the measuring device 7; this is illustrated in the lowermost line of FIG. 16. Since this modulation effect can in some circumstances not be readily distinguished from the modulation, which is imposed on the light bundle emitted from the measuring device 7, it initially remains not taken into consideration.

Since the oscillation signal of the resonant system is also conducted to the trigger input of the not retriggerable monostable oscillator 117, the Q-output, initially lying at logic zero, of this monostable oscillator switches at the instant $t_1$ to logic one and the $\bar{Q}$-output to logic zero as is reproduced in the second and third line from the top in FIG. 16. This switching operation is however delayed by the delay member 115 by the time $\tau_2$ and by the delay member 116 by the time $\tau_2 + \delta$ so that at first a logic zero remains maintained at the output of the delay member 115 and a logic one at the output of the delay member 116 as shown by the fourth and fifth line from the top in FIG. 16. Correspondingly, the switches 113 and 114 at first remain in the setting shown in FIG. 15 and the entire arrangement can oscillate undisturbed.

At the instant $t_2$, i.e. before run-down of the time $t_2$, the measuring device 7 again switches over to permanent light so that the oscillatory system no longer receives an excitation signal. Due to its inertia, the oscillatory system however still continues to oscillate somewhat with decreasing amplitude until the sensor 15 at the instant $t_3$ again goes over into the position which is forced on it by the direct voltage between the high voltage conductor 1 and the electrode 10. The decaying oscillation process occurring between the instants $t_2$ and $t_3$ leads to a brightness modulation of the light reflected from the mirror surface 22 to the measuring device and can there be evaluated as unambiguous characteristic of the functional capability of the sensor 15 and the entire oscillatory system.

After expiry of the delay time $\tau_2$, i.e. at the instant $t_4$, the logic one delivered from the Q-output of the monostable oscillator 117 also appears at the output of the delay member 115; because of the greater delay time $\tau_2 + \delta$ of the delay member 116, the logic one thereagainst at first still remains maintained at the control input of the change-over switch 114. Thus, initially only the change-over switch 113 is actuated and brought into the position illustrated by a dashed line in FIG. 15, whilst the change-over switch 115 remains in its rest position reproduced by a continuous line in FIG. 15. Thereby, the sensor 15 is on the one hand galvanically separated from the high voltage conductor 1 and short-circuited on the other hand. Thereby, the direct voltage dropping across the sensor 15 collapses and the sensor goes over into its zero position which corresponds to a voltage-free state. This leads to a brightness step 121 (see lowermost line in FIG. 16) in the light bundle reflected to the measuring device 7. The height of this brightness step represents a measure of the direct voltage present at the high voltage conductor 1.

At the time $t_4 + \delta$ the output signal of the delay member 116 goes over from a logic one to a logic zero so that then also the other change-over switch 114 goes over into the position illustrated by a dashed line in FIG. 15. Thereby, the sensor 15 lies with reversed polarity at the direct voltage which drops between the high voltage conductor 1 and the electrode 10. A deflection of the sensor now takes place in the direction opposite the previous deflection, which leads to a brightness step 122 (see lowermost line in FIG. 16) in the light bundle reflected to the measuring device.

If no brightness steps occur at the instants $t_4$ and $t_4 + \delta$, then this can mean either that no direct voltage is present at the high voltage conductor 1 or that the change-over switches 113 and 114 or the circuit units 117, 115 and 116 are not functionally capable. In order to be able to distinguish both these cases each from the other, the measuring device 7 once again emits a short alternating light signal 125 at the instant $t_5$, i.e. between both the instants $t_4$ and $t_4 + \delta$. The brightness modulation of this alternating light signal, when the zero-point circuit arrangement is functionally capable and the sensor 15 is thus short-circuited in this time span, must be reflected from the mirror surface 22 without additional modulation to the measuring device. In particular, it must not come to any kind of further oscillation processes, as they have occurred between the instants $t_2$ and $t_3$ after the instant $t_6$, in which the measuring device again switches over to continuous light. Should such a further oscillation occur after the instant $t_6$, then this means the zero-point circuit arrangement consisting of the monostable oscillator 117, the delay members 115 and 116 and the switches 113 and 114 is defective and that the freedom from voltage of the high voltage conductor 1 may not be deduced from the absence of the brightness step 121 and 122.

At the instant $t_7$, the monostable oscillator 117 again tips back into its initial state so that the logic one at its Q-output and the logic zero at its $\bar{Q}$-output disappear. With the delays $\tau_2'$ and $\tau_2' + \delta'$, also the outputs of the delay members 115 and 116 react hereto. Hereby, at the instant $t_8$, the change-over switch 113 is again brought into the setting illustrated by a continuous line in FIG. 15, whilst the change-over switch 114 initially remains in the position reproduced by a dashed line. Thereby, the sensor 15 is again temporarily separated from the voltage between the high voltage conductor 1 and the electrode 10 and at the same time short-circuited. When a direct voltage is present between the high voltage conductor 1 and the electrode 10, a brightness step 123 opposite to the brightness step 122 thus here occurs in the light bundle reflected to the measuring device 7.

At the instant $t_9$, a logic one then also appears at the output of the delay member 116, whereby the switch 114 returns into its initial position reproduced by a continuous line in FIG. 15. Thereby, the sensor 15 is again switched in the original polarity between the high voltage conductor 1 and the electrode 10. In the presence of a direct voltage between the high voltage conductor 1 and the electrode 10, a brightness step 124, which is opposite to the brightness step 121, occurs at the instant $t_9$ in the brightness of the light bundle reflected to the measuring device 7.

Additionally or alternatively to the controllable switches 103 and 104, which are connected in parallel with the sensor 15 and shown in FIG. 14, a controllable on-off switch, which lies in series with the sensor 15 and is then controlled in opposite phase to the switches 103 and 104, can be provided in one of both the lines 18 and 19. This switch is closed in the rest state so that the voltage between the high voltage conductor 1 and the electrode 10 can get unhindered to the sensor 15. When the switches 103 and 104 are closed, then this switch is opened, whereby on the one hand a voltage possibly present between the high voltage conductor 1 and the electrode 10 collapses and the sensor 15 is made free of voltage on the other hand.

What is claimed is:

1. Arrangement for measuring electric voltage parameters of a high voltage conductor which, when high voltage energy is transmitted therethrough, is surrounded by an electric field, wherein said arrangement comprises a sensor unit which is arranged in the close proximity of said high voltage conductor and which comprises two electric field conductors which are arranged spaced apart and electrically isolated from each other in such a manner that said electric field generates a voltage drop therebetween, a sensor means having two electric connection terminals, and two electric connection conductors one of which connects one of said two electric connection terminals of said sensor means with one of said electric field conductors and the other one of which connects the second one of said two electric connection terminals of said sensor means with the second one of said electric field conductors, a measuring device which is arranged remote from said high voltage conductor and which comprises a light source emitting a light bundle, a projection device projecting said light bundle onto said sensor means, and a photo-electric receiver receiving at least part of said light bundle after its reflection from said sensor means which modifies said light bundle in dependence on said electric field surrounding said high voltage conductor, said photo-electric receiver generating output signals which are evaluated for measuring said electric voltage parameters, a generator means for generating an excitation signal which generator means is arranged remote from said high voltage conductor, a transmitter means for transmitting said excitation signal to said sensor unit, and a receiving and exciting means which is arranged in said sensor unit for receiving said transmitted excitation signal and, upon receipt thereof, for exciting said sensor means to a modification of said light bundle which modification is independent of any high voltage energy transmitted in said high voltage conductor.

2. Arrangement according to claim 1, wherein said receiving and exciting means comprises an oscillatory system which includes said sensor means and a photoelectric receiving means and which, upon receipt of said excitation signal, is excited to a resonant oscillation having an amplitude and a damping behaviour which depend, among others, on the instantaneous temperature of said sensor means and on further environmental influences, wherein said generator means forms part of said measuring device and comprises a modulation means by which the brightness of said light bundle is modulated at a frequency which about corresponds to the resonant frequency of said oscillatory system, and wherein said transmitter means comprises said projecting device and a beam splitting means, projecting part of said transmitted light bundle onto said photo-electric receiver means of said oscillatory system.

3. Arrangement according to claim 2, wherein said photo-electric receiving means of said oscillatory system is a photo-diode, wherein said oscillatory system further comprises a protective resistor and a capacitor, and wherein one of said two electric connection terminals of said sensor means is connected to one of two electric connection terminals of said photo-diode, the second electric connection terminal of which is connected to one of two electric connection terminals of said protective resistor, the second electric connection terminal of which is connected to one of two electric connection terminals of said capacitor, the second electric connection terminal of which is connected to the second one of said electric connection terminals of said sensor means.

4. Arrangement according to claim 2 or 3, wherein said measuring device evaluates the output signals which are generated by said photo-electric receiver upon an excitation of said oscillatory system by a transmitted excitation signal for measuring said amplitude of said resonant oscillation of said oscillatory system in order to take into account the instantaneous temperature of said sensor means and for eliminating further environmental influences.

5. Arrangement according to claim 2 or 3, wherein said measuring device evaluates the output signals which are generated by the photo-electric receiver upon an excitation of said oscillatory system by a transmitted excitation signal for measuring said damping behaviour of said resonant oscillation of said oscillatory system in order to take into account the instantaneous temperature of said sensor means and for eliminating further environmental influences.

6. Arrangement according to claim 1, wherein said sensor unit directly touches said high voltage conductor, wherein one of said electric field conductors is a not earthed electrode extending substantially along an equipotential surface of said electric field surrounding said high voltage conductor and wherein the second one of said electric field conductors is said high voltage conductor itself.

7. Arrangement according to claim 6, wherein said not earthed electrode has about the shape of a circular cylinder which concentrically surrounds said high voltage conductor.

8. Arrangement according to claim 7, wherein said not earthed electrode is held at a spacing from said high voltage conductor by insulators and wherein said sensor means is arranged in an intermediate space between said not earthed electrode and said high voltage conductor.

9. Arrangement according to claim 7, wherein said not earthed electrode is separated from said high voltage conductor by a layer of insulating material, which serves as a mechanical carrier and the thickness of which determines the spacing between said not earthed electrode and said high voltage conductor.

10. Arrangement according to claim 1, wherein said sensor unit directly touches said high voltage conductor, wherein one of said electric field conductors is a first not earthed electrode being arranged in an insulated manner at a fixedly predetermined spacing from said high voltage conductor and extending substantially along an equipotential surface of said electric field surrounding said high voltage conductor, wherein the second one of said electric field conductors is a second not earthed electrode being arranged in an insulated manner at a fixedly predetermined spacing from said high voltage conductor, different from said spacing of said first not earthed electrode, and also extending substantially along an equipotential surface of said electric field surrounding said high voltage conductor.

11. Arrangement according to claim 10, wherein each of said first and said second not earthed electrodes has about the shape of a circular cylinder which surrounds said high voltage conductor concentrically.

12. Arrangement according to claim 1, wherein said first and said second not earthed electroces are held at a spacing from said high voltage conductor and each from the other by insulators and wherein said sensor means is arranged in an intermediate space between said first and said second not earthed electrodes.

13. Arrangement according to claim 1, wherein one of said electric field conductors is a not earthed electrode extending substantially along an equipotential surface of said electric field surrounding said high voltage conductor and wherein the second one of said electric field conductors is an auxiliary conductor which is galvanically connectable with said high voltage conductor.

14. Arrangement according to claim 13, wherein said not earthed electrode is held at a spacing from said auxiliary conductor by insulators and wherein said sensor means is arranged in the intermediate space between said not earthed electrode and said auxiliary conductor.

15. Arrangement according to claim 1, wherein said sensor means is a mechanical oscillator in the shape of an elongate rod which is mechanically clamped in the proximity of its one end and at the end face of its free end has a reflecting layer onto which said light bundle of said light source is projected.

16. Arrangement according to claim 15, wherein said mechanical oscillator consists of a piezo-electric material.

17. Arrangement according to claims 15 or 16, wherein said reflecting layer is evaporated onto said end face of said free end of said mechanical oszillator.

18. Arrangement according to claim 15, wherein said sensor unit further comprises a resting mirror which is arranged in the proximity of said sensor means and wherein a part of said light bundle, which is projected by said projection device onto said sensor means, is projected onto said resting mirror by which part of it is reflected and projected by way of said projection device to said photo-electric receiver of said measuring device.

19. Arrangement according to claim 18, wherein said sensor unit further comprises a stationary aperture which is arranged in front of said free end of said mechanical oscillator and wherein the side of said stationary aperture facing said light source carries said resting mirror and is imaged by said projection device onto said photo-electric receiver of said measuring device.

20. Arrangement according to claim 18, wherein said projection device comprises a light-conducting fibre, the one end face of which is so arranged that it lies directly opposite to said free end of said mechanical oscillator in the rest setting thereof and the other end face of which is imaged onto said photo-electric receiver of said measuring device.

21. Arrangement according to claim 20, wherein said other end face of said light-conducting fibre is imaged onto said photo-electric receiver of said measuring device with the aid of a further light-conducting fibre which is optically couplable through a pluggable connector with said first light-conducting fibre.

22. Arrangement according to claim 1, wherein said measuring device is freely movable relative to said sensor unit.

23. Arrangement according to claim 1, wherein said sensor unit is firmly mounted at said high voltage conductor.

24. Arrangement according to claim 1, wherein said sensor unit is pluggable onto said high voltage conductor.

25. Arrangement according to claim 1, wherein said sensor unit has a housing with outside walls which are provided in the manner of a high voltage insulator withh protruding ribs and depressions laying therebetween for inhibiting surface leakage currents.

26. Arrangement according to claim 13, wherein said arrangement further comprises an insulating rod at the one end of which is arranged said auxiliary conductor, which is bringable into contact with said high voltage conductor.

27. Arrangement according to claim 26, wherein said auxiliary conductor has a trough-shaped depression, by which it is pressable against said high voltage conductor.

28. Arrangement according to claim 26, wherein said auxiliary conductor has a hook, by which it is hookable at said high voltage conductor.

29. Arrangement according to claim 26, wherein said insulating rod is a hollow rod in the interior of which said sensor unit is arranged and out of the one end of which protrudes said auxiliary conductor, and wherein said measuring device is fastened at the other end of said insulating rod.

30. Arrangement according to claim 1, wherein said sensor unit further comprises a zero-point circuit arrangement with the aid of which said sensor means can be caused to deliver signals from which its zero position can be derived, which corresponds to the high voltage-free state of said high voltage conductor.

31. Arrangement according to claim 30, wherein said zero-point circuit arrangement comprises a controllable switch arrangement, with the aid of which a voltage present at said sensor means is variable, and a control circuit which is triggerable by a command signal for actuation of said switch arrangement.

32. Arrangement according to claim 31, wherein said switch arrangement comprises at least one controllable on-off switch, which is opened in its rest state and short-circuits a voltage dropping across said sensor means in its closed state.

33. Arrangement according to claim 30 or 31, wherein said switch arrangement comprises at least one controllable on-off switch which is arranged in one of said two electric connection conductors connecting said two electric connection terminals of said sensor means with the respective one of said two electric field conductors and which is closed in its rest state.

34. Arrangement according to claim 31, wherein said switch arrangement comprises two controllable change-over switches each being arranged in one of said two electric connection conductors and having a first switching position in which a first one of said electric connection terminals of said sensor means is connected with the first one of said two electric field conductors and the second one of said electric connection terminals of said sensor means is connected with the second one of said electric field conductors, and a second switching position in which said first one of said electric connection terminals of said sensor means is connected with said second one of said electric field conductors and said second one of said electric connection terminals of said sensor means is connected with said first electric field conductor.

35. Arrangement according to claim 31, wherein said control circuit comprises a monoflop, which is triggerable by means of said command signal and through which said switch arrangement can be brought out of its rest setting into an operative setting for a predetermined time and then back again into its rest setting.

36. Arrangement according to claim 35, wherein a part of said excitation signal serves as a command signal for triggering said monoflop and wherein a delay member is connected between said controllable switch arrangement and each output of said monoflop controlling said switch arrangement.

37. Arrangement according to claim 31, wherein said control circuit comprises a photo-diode, which operates photo-voltaically and is drivable by a constant light command signal, wherein a series circuit consisting of a capacitor and a resitor is connected in parallel with said photo-diode, and wherein a voltage, which drops across said resistor on the flowing of a charging current into said capacitor serves as control signal for said controllable switch arrangement.

38. Arrangement according to claim 37, wherein said controllable switch arrangement consists of two semiconductor switches with diode characteristics, which are connected with opposite polarity each in series with the other and in parallel with said sensor means.

* * * * *